United States Patent [19]

Petr et al.

[11] Patent Number: 4,742,296
[45] Date of Patent: May 3, 1988

[54] ARRANGEMENT FOR MEASURING ELECTRICAL POWER

[75] Inventors: Jan Petr, Oberwill; Radivoje Popovic; Thomas Seitz, both of Zug, all of Switzerland

[73] Assignee: LGZ Landis & Gyr ZUG AG, Zug, Switzerland

[21] Appl. No.: 922,124

[22] Filed: Oct. 22, 1986

[30] Foreign Application Priority Data

Feb. 10, 1986 [CH] Switzerland ............... 00516/865

[51] Int. Cl.$^4$ ................. G01R 21/08; G01R 21/133
[52] U.S. Cl. .................................. 324/142; 324/130; 324/117 R
[58] Field of Search ............... 307/261, 270, 228; 328/151, 15, 150, 127, 128; 324/117 R, 117 H, 130, 127, 142; 357/27; 364/847, 483

[56] References Cited

U.S. PATENT DOCUMENTS 4,124,821 11/1978 Petr ................................. 328/151

FOREIGN PATENT DOCUMENTS 0109644 5/1984 European Pat. Off. ........ 324/117 H
0163460 12/1985 European Pat. Off. ............ 324/142

Primary Examiner—Reinhard J. Eisenzopf
Assistant Examiner—W. Burns
Attorney, Agent, or Firm—Marmorek, Guttman & Rubenstein

[57] ABSTRACT

The present invention is an arrangement for measuring electrical power. The arrangement comprises a conductor traversed by an electrical current i and a voltage-to-current converter for transforming an electrical voltage $u_N$ into a proportional supply current $i_N$ for a Hall element. The Hall element is adapted to produce an intelligence containing output signal $\pm u_H$ proportional to the product ($\pm i.u_N$) of the current i and the voltage $\pm u_N$. The Hall element is arranged in an air-gap of a ferromagnetic core that is excited by the current i. A voltage-to-frequency converter transforms the Hall element output voltage $\pm u_H$ into a proportional output frequency. The voltage-to-frequency converter includes a capacitor for integration purposes and at least two signal sources. The power measuring device also includes a switch for periodically switching a signal proportional to the signal $\pm u_H$ and for switching said signal sources to compensate for an offset voltage. Use of the arrangement permits an improvement in the ratio of the intelligence containing signal to an interference signal, which interference signal includes for example an offset voltage.

42 Claims, 11 Drawing Sheets

ARRANGEMENT FOR MEASURING ELECTRICAL POWER

FIELD OF THE INVENTION

The invention relates to an arrangement for measuring electrical power.

BACKGROUND OF THE INVENTION

An arrangement for measuring electrical power is disclosed in DE-OS No. 2,749,784. In the arrangement of this patent, at the output of a Hall element., a differential amplifier is used that has a large common mode voltage and a rejection. Differential amplifiers of this kind are complicated and expensive. Process electronics at the output of the Hall element, including among other things, the differential amplifier and a voltage/frequency converter at the output of the differential amplifier must, in case of precise measurements, have a good linearity and a high suppression of interference signals, especially a high suppression of offset voltages.

It is the object of this invention to create a long-term stable arrangement for measuring electrical energy that has a high sensitivity and a high intelligence signal/interference signal ratio. In particular, it is a further object of the present invention to provide an arrangement for measuring electrical energy that does not require a complicated differential amplifier at the output of a Hall element.

SUMMARY OF THE INVENTION

The present invention is an arrangement for measuring electrical power. The arrangement comprises a conductor traversed by an electrical current i and a voltage-to-current converter for transforming an electrical voltage $u_N$ into a proportional supply current $i_N$ for a Hall element. The Hall element is adapted to produce an intelligence containing output signal $\pm u_H$ proportional to the product ($\pm i \cdot u_N$) of the current i and the voltage $\pm u_N$. The Hall element is arranged in an airgap of a ferromagnetic core that is excited by the current i. A voltage-to-frequency converter transforms the Hall element output voltage $\pm u_H$ into a proportional output frequency. The voltage-to-frequency converter includes a capacitor for integration purposes and at least two signal sources. The power measuring device also includes a switch for periodicically switching a signal proportional to the signal $\pm u_H$ and for switching said signal sources to compensate for an offset voltage. Use of the arrangement permits an improvement in the ratio of the intelligence containing signal to an interference signal, which interference signal includes, for example, an offset voltage.

BRIEF DESCRIPTION OF THE DRAWINGS

The same reference numerals are used to designate the same parts in all the Figures of the drawing.

DETAILED DESCRIPTION OF THE INVENTION

Figure 1:
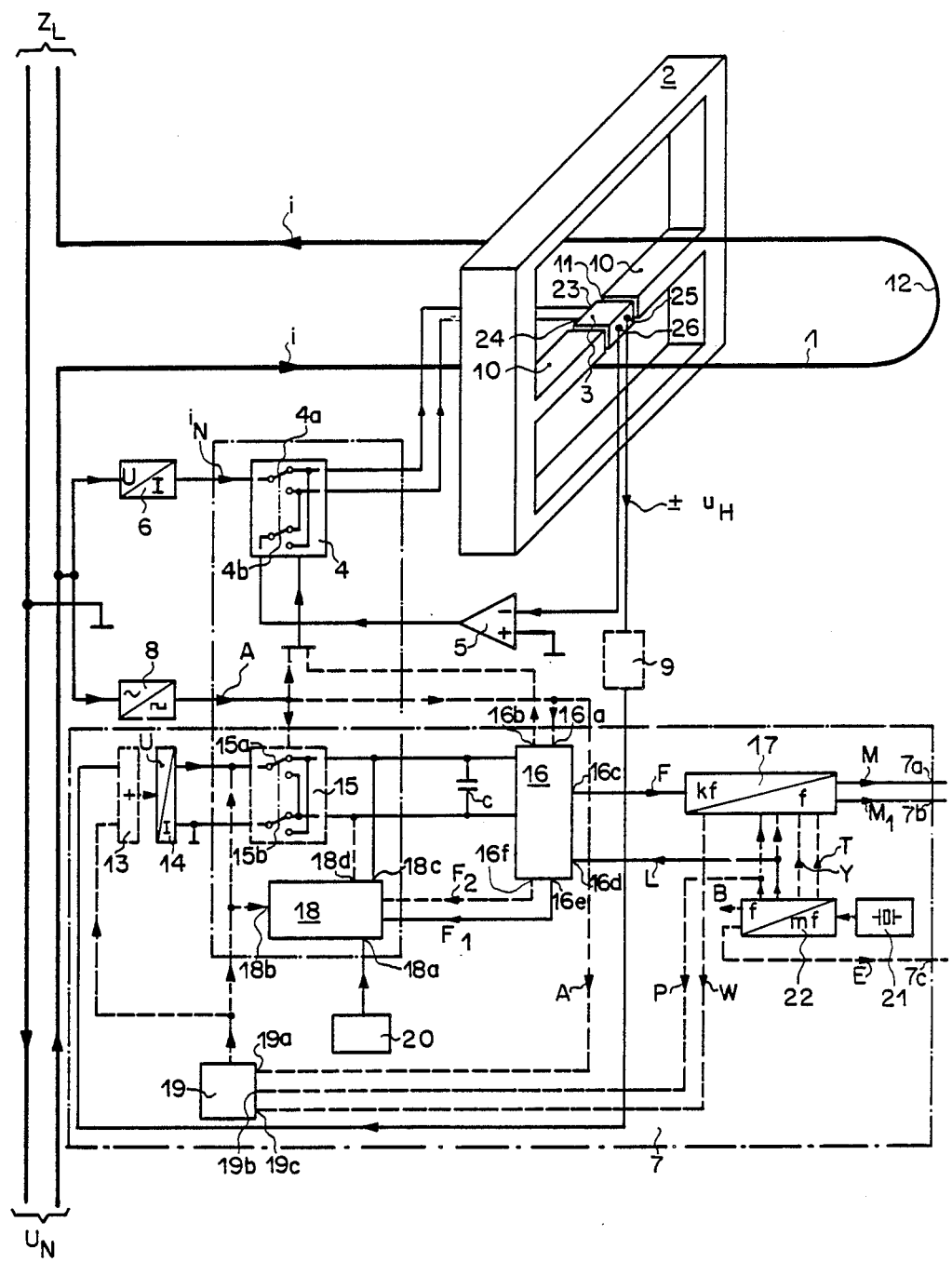
FIG. 1 shows a block diagram of an arrangement for measuring electrical energy, in an illustrative embodiment of the present invention.

All the components of the described apparatus are for example fabricated using CMOS-technology and are supplied then by a positive direct current supply voltage $V_{DD}$ and a negative direct current supply voltage $-|V_{SS}|$, both of those voltages having ground as reference potential. The direct current supply voltages $V_{DD}$ and $-|V_{SS}|$ are for example derived through use of a power rectifier from the voltage $u_N$ of an electrical power supply networks. For purposes of clarity, the power supply rectifier and the direct current supply voltages $V_{DD}$ and $-|V_{SS}|$ are not shown in the Figures.

In the Figures, all the optional connections and components are shown with dotted lines. All the periodic or clock inputs that are controlled with positive (leading) edges are each characterized in the drawing symbolically with a white triangle, while all the cycle inputs that are controlled with negative (trailing) edges, are each characterized with black triangles. The arrangement illustrated in FIG. 1 comprises a conductor 1 that is traversed by an electrical current i, a ferromagnetic core 2 that is activated by the current i, a Hall element 3 as magnetic field sensor and multiplier, a switch 4, a control amplifier 5, a first voltage/current converter 6, a voltage/frequency converter 7, a control device 8 and an optional high pass amplifier 9. The ferromagnetic core 2 is almost closed and preferably three-legged. Its center leg 10 has at least one air gap 11, where the Hall element 3 is arranged. The center leg 10 with the air gap 11 and the Hall element 3 is also at least partially surrounded by an electrical conductor 1. Illustratively, the conductor 1 forms a U-shaped loop 12, having an outgoing conducting path and a return conducting path. Between the outgoing and return conducting paths of the U-shaped loop 12, the Hall element 3 is arranged. The current i which is fed from the supply net with the voltage $u_N$ into the load impedance $Z_L$, flows through the U-shaped loop 12.

The voltage/frequency converter 7 comprises an optional addition element 13, a second voltage/current converter 14, an optional second switch 15, a capacitor C, a monitoring and control device 16, an output frequency divider 17, a circuit device 18, a first signal source 19, a second signal source 20, a periodic pulse generator 21 and a frequency divider 22.

The two switches 4 and 15 are similarly fabricated two-pole switches, i.e. each switch 4 and 15 comprises two switch contacts 4a and 4b, 15a and 15b respectively that are, for example, constructed through use of known CMOS-technology.

The un-grounded connection pole of the voltage $u_N$ is connected to the input of the voltage/current converter 6 and also to the input of the control device 8. The Hall element 3 has two input connections 23 and 24 that together form the supply input 23;24 of the Hall element 3 and it also has two output connections 25 and 26. The first output connection 25 is the one pole output of the Hall element 3. The voltage potential originating at the second output connection 26 is the reference potential of the output voltage of the Hall element 3 (i.e., the voltage at output 25 is measured relative to the reference potential at output 26). The output connection 26 that carries the reference potential is led to the inverting input of the control amplifier 5. The non-inverting input of this control amplifier 5 is grounded. The output of the amplifier 5 is connected by way of the second switch contact 4b to one of the input connections 23, 24 of the Hall element 3. The switch 4 is connected to the Hall element 3, to the voltage/current converter 6 and to the control amplifier 5 in such a manner that, in the first position of the switch (i.e., the position illustrated in FIG. 1), it connects with the first switch contact 4a the output of the voltage/current converter 6 to the first input connection 23 of the Hall element 3. With its second switch contact 4b, the pole switch 4 connects the output of the control amplifier 5 to the second input connection 24 of the Hall element 3. In the second position of the switch 4 the output of the voltage/current converter 6 is connected by way of the first switch contact 4a to the second input 24 of the Hall element, and the output of the control amplifier 5 is connected by way of the second switch contact 4b to the first input connection 23 of the Hall element. Between the output connection 25 of the Hall element 3 and the input of the voltage/frequency converter 7, the optional high pass amplifier 9 is arranged.

FIG. 1 illustrates simultaneously first and second embodiments of the arrangement and also three sub-embodiments of the second embodiment. In all embodiments and sub-embodiments, the signal source 20 is a constant current source, the first connection of which (not shown) is connected to the negative direct current supply voltage $-|V_{SS}|$ and the second connection of which is, in accordance with FIG. 1, connected to a first connection 18a of the switch device 18. In the first embodiment and in the first sub-embodiment of the second embodiment, the signal source 19 is also a constant current source, the first connection of which (not shown) is connected to the positive direct current supply voltage $V_{DD}$ and the second connection of which forms the output of the signal source 19. In the first embodiment and first sub-embodiment of the second embodiment, the signal source 19 is connected to an un-grounded output connection of the voltage/current converter 14 (see FIG. 1).

In the second and third sub-embodiments of the second embodiment, the signal source 19 is a voltage source. More particularly, the signal source 19 is a constant voltage source in the second embodiment, and a circuit comprising elements 27;28;29;30 of FIG. 2 in the third sub-embodiment. The negative connection in each case being grounded and their positive connection forming the output of the signal source 19. In this case, the signal source 19 is connected to the first input of the addition element 13. The addition element 13 is only present in those two last mentioned sub-embodiments of the second embodiment and the second pole switch 15 is only present in the second embodiment. In the third sub-embodiment of the second embodiment, the high pass amplifier 9 is omitted, while the circuit 27;28;29;30 that is used in this sub-embodiment as signal source 19 preferably has the construction illustrated in FIG. 2.

Figure 2:
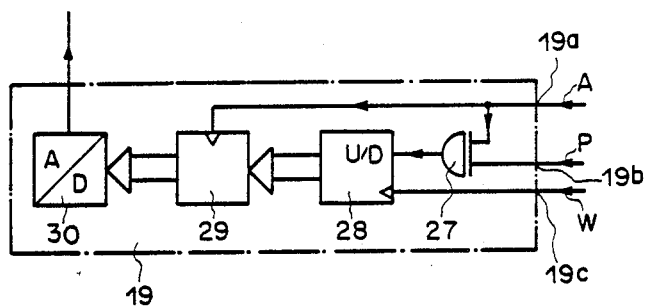
FIG. 2 shows a block diagram of a regulator serving as a signal source.

The circuit 27;28;29;30 comprises, in accordance with FIG. 2, an exclusive-or gate 27, a forwards/backwards (i.e., up/down) counter 28, an intermediate accumulator 29 and a digital/analog converter 30. A data bus connection is present between the forwards/backwards counter 28 and the intermediate accumulator 29 and also between the intermediate accumulator 29 and the digital/analog converter 30. The output of the control device 8 (see FIG. 1), where a switch signal A is located, is in this third sub-embodiment connected by way of a first input 19a of the signal source 19 to a first input of the exclusive-or gate 27 and to a periodic input of the intermediate accumulator 29 (see FIG. 2). A periodic signal P is delivered from the frequency divider 22 and is connected by way of a second input 19b of the signal source 19 to a second input of the exclusive-or gate 27. A signal W from the output frequency divider 17 (see FIG. 1) is connected by way of a third input 19c of the signal source 19 to a periodic input of the forwards/backwards counter 28 (see FIG. 2). The output of the exclusive-or gate 27 is connected to an "up/down" input U/D of the forwards/backwards counter 28. The output of the digital/analog converter 30 forms the output of the circuit 27;28;29;30 and thus forms the output of the signal source 19.

In the first embodiment, the output connection 25 of the Hall element 3 is directly connected by way of the optional high pass amplifier 9 to the input of the voltage/current converter 14. The output of the voltage/current converter 14 is directly connected by way of two output poles to the capacitor C and to the two-pole input of the monitoring and control device 16, since the addition element 13 and also the pole switch 15 are not present in this embodiment.

In all three sub-embodiments of the second embodiment, the output of the voltage/current converter 14 is connected by way of two poles over a two-pole switch 15 to the capacitor C (which is connected at the output side of the switch 15) and to the two-pole input of the monitoring and control device 16. In the first sub-embodiment, the addition element 13 is missing, so that the output connection 25 of the Hall element 3 again is connected directly by way of the optional high pass amplifier 9 to the input of the voltage/current converter 14. In the second and third sub-embodiment of the second embodiment, however, where the output of the signal source 19 is led to the first input of the addition element 13, the output connection 25 of the Hall element 3 is connected to second input of the addition element 13. In this case, as already mentioned, the high pass amplifier 9 is only optional. The output of the addition element 13 is then led to the input of the voltage/current converter 14. One output pole of the voltage/current converter 14 is grounded in all embodiments and sub-embodiments.

Figure 3:
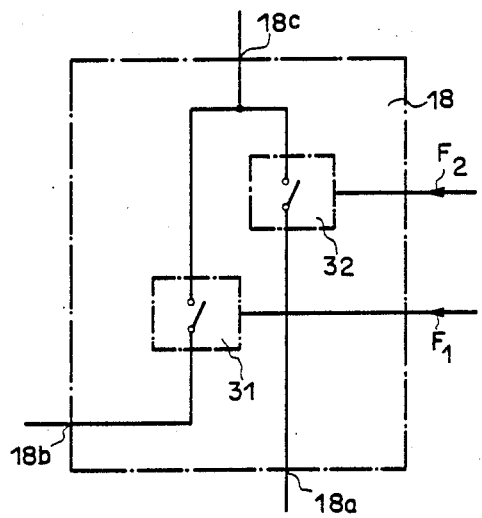
FIG. 3 shows a diagram of a first variant of a switch apparatus.

In the first embodiment, the switching device 18 comprises, in accordance with FIG. 3, two controllable switches 31 and 32 that have a shared connection which is connected to a third terminal 18c of the circuit device 18. The other un-shared connection of switch 31 is led to the second terminal 18b of switching device 18 and the unshared connection of switch 32 is led to the first terminal 18a of the circuit device 18. Switch 31 is controlled by a control signal F₁ and switch 32 is controlled by a control signal F₂. Both are supplied from the monitoring and control device 16 (see FIG. 1). The construction of the monitoring and control device 16 for this embodiment can be seen in FIG. 7 which will be described later. In accordance with FIG. 1, the third connection 18c of the switching device 18 is connected to the un-grounded connection of the capacitor C, while the first and second connections 18a and 18b are led to a connection of one of the two signal sources 19, 20, respectively.

Figure 4:
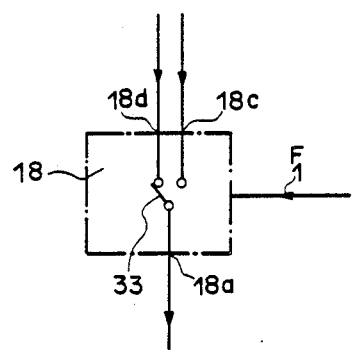
FIG. 4 shows a diagram of a second variant of a switch apparatus.

In the three sub-embodiments of the second embodiment, the switching device 18 comprises, in accordance with FIG. 4, a one-pole switch 33 (see FIG. 4). In one position, as shown in FIG. 4, the one-pole switch 33 connects the first connection 18a of the switching device 18 to a fourth connection 18d of the switching device 18. In the other position, the switch 33 connects the first connection 18a to the third connection 18c of the switching device 18. In all three sub-embodiments, the third and the fourth connections 18c and 18d of the switching device 18 are, in accordance with FIG. 1, connected directly to a connection of the capacitor C. A connection of the signal source 20 is thus connected over the switch 33 to either one or the other connection of the capacitor C, depending on the position of the switch 33. Switch 33 is controlled by the control signal $F_1$ that is delivered, in accordance with FIG. 1, from the monitoring and control device 16, that this time has the construction illustrated in FIG. 8 which will be described later.

The output of the control device 8, where a periodic switch signal A is located, is, in the first embodiment, connected to a control input 16a of the monitoring and control device 16 where the switch signal A is processed and led to an auxiliary control output 16b. This auxiliary control output 16b is connected to the control input of the pole switch 4. In the three sub-embodiments of the second embodiment, the output of the control device 8 is directly connected to a control input of the switches 4 and 15 and additionally, in the third subembodiment, as already mentioned, to the input 19a of the signal source 19 that is illustrated by the circuit arrangement 27;28;29;30 of FIG. 2. The two-pole switches 4 and 15 are thus controlled by the same switch signal A.

The switch signal B may be used as a substitute for the switch signal A. The signal B is produced by the frequency divider 22. In this case, the control device 8 can be eliminated and the switch signal B must be led by means of connections (not shown here) to all those connections to which the switch signal A was led.

The signal output of the monitoring and control device 16, where a signal F is located, is led to a first signal input of the frequency divider 17. The frequency divider 17 has two signal outputs, i.e., the signals M and M₁. The signals M and M₁, are at the same time the signal outputs 7a and 7b of the voltage/frequency converter 7.

The output of the periodic signal generator 21 is connected to an input of the frequency divider 22 that has, for example, six outputs. The first output of the frequency divider 22 is a periodic signal P of the frequency $f_R/2$. In the second embodiment, the signal P is led to a second signal input of the output frequency divider 17. The second output of the frequency divider 22 is a periodic signal L of the frequency $f_R$. The signal L is, in all embodiments, connected to a periodic input of the monitoring and control device 16 and, in the second embodiment, to a first periodic input of the frequency divider 17. The third output of the frequency divider 22 is the periodic signal T of frequency $f_R/128$. In the second embodiment, the signal T is connected to a second periodic input of the output frequency divider 17. The fourth output of the frequency divider 22 is a periodic signal Y of frequency $2f_R$. In the second embodiment, the signal Y is connected to a third periodic input of the output frequency divider 17. The fifth output of the frequency divider 22 is a periodic signal E of frequency $f_R/32$. The signal E is optional and is, for instance, used in the electricity meter illustrated in FIG. 16. The signal E is connected to an optional periodic output 7c of the voltage/frequency converter 7. At the sixth output of the frequency divider 22 is the previously mentioned switch signal B. Also, in the third sub-embodiment of the second embodiment, the periodic signal P and an output of the output frequency divider 17 that is carrying the signal W are, as already mentioned, connected to inputs 19b and 19c, respectively, of the signal source 19, which source 19 comprises in a particular embodiment elements 27;28;29;30 of FIG. 2.

The periodic generator 21 is, for instance, quartz stabilized and produces rectangular periodic pulses of, for instance, the frequency $2^{15}$ Hz=32,768 kHz. This frequency is divided by m in the frequency divider 22 that is connected at the output thereof. In the second embodiment, M has the values $2^4$, $2^5$, $2^6$, $2^{10}$, $2^{11}$ and $2^{12}$, for the production of the frequencies $2f_R = 2^{11}$ Hz for the periodic signal Y, $f_R = 2^{10}$ Hz for the periodic signal L, $f_R/2 = 2^9$ Hz for the periodic signal P, $f_R/32 = 25$ Hz for the periodic signal E, $f_R/64 = 24$ Hz = 16 Hz for the switch signal B and $f_R/128 = 23$ Hz for the periodic signal T. However, in the first embodiment, the frequency divider 22 only has the two outputs where the periodic signals L and E are located.

The device 8, if present, transforms the sine shaped voltage $u_N$ of the electric supply net into rectangular pulses of the switch signal A. The device 8 preferably comprises a Schmitt-Trigger (not shown) and another frequency divider connected at the output thereof. The voltage $u_N$ is transformed in the Schmitt-Trigger into a periodic rectangular pulse signal of the same frequency. The two circuit waves of the Schmitt-Trigger are preferably chosen so that switching occurs in the frequency divider that is connected at the output side exactly when the zero crossings of the voltage $u_N$ occur. In the frequency divider, the, for example, 50 Hz- or 60 Hz-frequency of this rectangular pulse signal is divided by n, where n, for example, has the value $2^2$, for the production of a frequency of 12.5 Hz or 15 Hz for the switch signal A.

In the first embodiment, the two-pole switch 4 is periodically switched between the connections 16a and 16b of the monitoring control device 16 and in the second embodiment, the two switches 4 and 15 are periodically switched directly and synohronously by the switch signal A of frequency 12.5 Hz or 15 Hz or by the switch signal B of the frequency 16 Hz, respectively.

In all the embodiments, the voltage/current converter 6 transforms the electric voltage $u_N$ into a proportional current $i_N$. This current $i_N$, reaches the Hall element 3 as a supply current through the switch 4 that is located in the supply current conductors of the Hall element 3. Illustratively, the pole switch 4 is periodically switched by the periodic signal A or B. This Hall element 3 is at the same time exposed to a magnetic field that was produced by the current i and this magnetic field is proportional to the current i. The output voltage $\pm U_H$ produced by the Hall element 3 serves as an intelligence signal. During odd half periods of the switch signal A or B, the output of the Hall element is proportional to the product $u_N \cdot i$ and, during even half periods, proportional to the product $(-u_N) \cdot i$. Thus, the sign of the multiplication that is realized by the Hall element 3 may be switched with the switch signals A or B. In other words, the output voltage of the Hall element $u_H$ is given by the product $\pm i \cdot u_N$.

The control amplifier 5 acts as a comparator having the reference voltage value of zero volts as the desired value and having the voltage potential at the second output connection 26 of the Hall element 3 as an actual value. The actual value is at the same time the reference potential of the output voltage of the Hall element 3 and is compensated through use of the control amplifier 5, i.e., regulated down to zero volts. In order to achieve this, the control amplifier 5 compares the desired value with the actual value and produces at its output a voltage that is proportional to the desired value/actual value difference. The difference voltage is connected by way of the switch contact 4b to the Hall element 3, and works against the voltage potential at the output connection 26 of the Hall element in such a manner, that the desired value/actual value difference equals zero. If this is the case, then the voltage potential of the output connection 26 equals the reference voltage of the amplifier 5, i.e., zero volts. The polarity of the interference component is not affected by the periodic switching of the pole switch 4. The interference component results, for example, from the non-linearity of the internal resistance of the Hall element 3 and the thermo voltage of the Hall element 3. The interference component is thus independent of the periodic polarity switching of the supply current $i_N$ and thus of the product $u_N \cdot i$.

Figure 5:
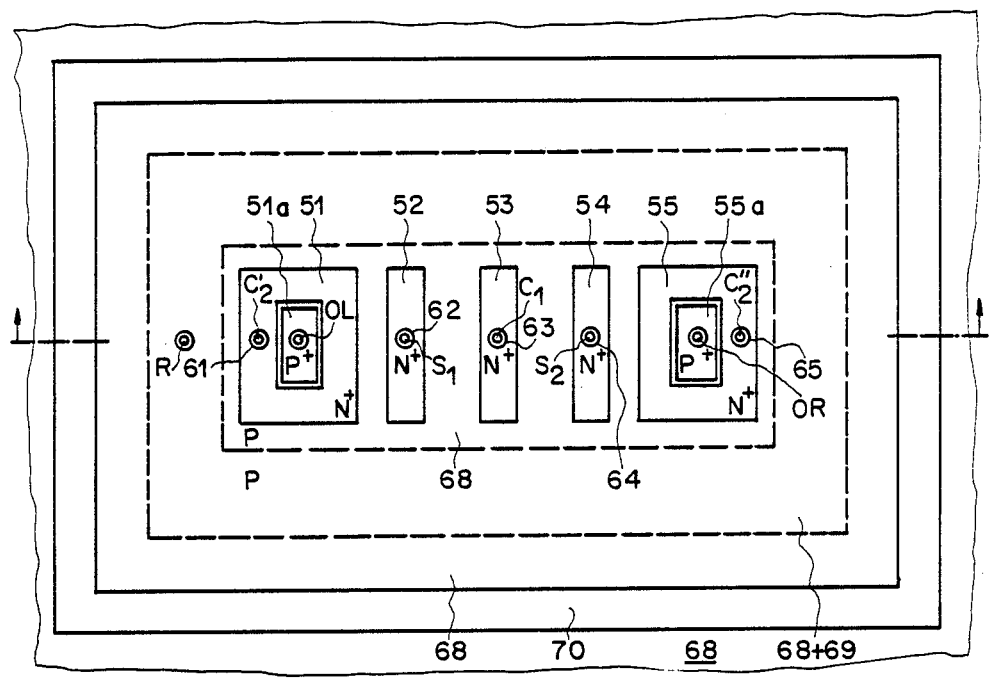
FIG. 5 shows a plan view of a Hall element.
Figure 6:
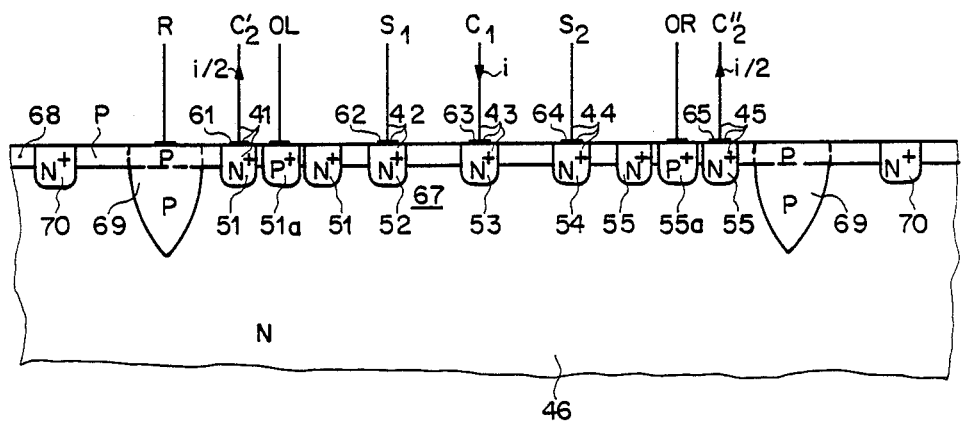
FIG. 6 shows a cross-section of the Hall element illustrated in FIG. 5.

The construction of the Hall element 3 is illustrated in FIGS. 5 and 6. It is realized in such a manner that the Hall element 3 is stable over long periods of time. The sensitivity of this Hall element 3 is about 1 volt/(mA.-Tesla) and its interference component can be eliminated or at least reduced through use of an additional gate connection.

The Hall element 3 shown in FIGS. 5 and 6 comprises at least one outer current electrode 41, a first sensor electrode 42, a center current electrode 43, a second sensor electrode 44 and a second outer current electrode 45. All of these electrodes are positioned in an approximately straight line next to each other and in the given order at the surface of a semi-conductor material 46 which has a predetermined conductivity type, for example N. The two sensor electrodes 42 and 44 and also the two outer current electrodes 41 and 45 are each located almost symmetrically relative to the center current electrode 43. The connection contacts of the electrodes 41 through 45 can be formed as ohmic contacts, as Schottky-diodes or as P/N-diodes. The connection contacts of the current electrodes 41, 43 and 45 are preferably formed as ohmic contacts. It was assumed in FIGS. 5 and 6 for reason of simplicity that the connection contacts of the sensor electrodes 42 and 44 are also ohmic contacts. In this case, the connection contact of each electrode 41 through 45 comprises a contact diffusion region 51 through 55. Each contact diffusion region 51-55 is heavily doped with impurity atoms and comprises material that is of the same conductivity type N as the semi-conductor material 46. Each diffusion region 51-55 also includes a metallic connection contact 61 through 65. All contact diffusion regions 51 through 55 thus comprise N+-material.

The first outer current electrode 41 includes a first outer current connection $C'_2$ and a connection contact 51;61, that comprises a contact diffusion region 51 and a metallic connection contact 61.

The first sensor electrode 42 includes a sensor connection $S_1$ and a connection contact 52;62 that comprises a contact diffusion region 52 and a metallic connection contact 62.

The center current electrode 43 includes a center current connection $C_1$ and a connection contact 53;63 that comprises a contact diffusion region 53 and a metallic connection contact 63.

The second sensor electrode 44 includes a second sensor connection $S_2$ and a connection contact 54;64 that comprises a contact diffusion region 54 and a metallic connection contact 64.

The second outer current electrode 45 includes a second outer current connection $C''_2$ and a connection contact 55;65 that comprises a contact diffusion region 55 and a metallic connection contact 65.

The part of the semi-conductor material 46 that lies underneath the center current electrode 43 and the two sensor electrodes 42 and 44 forms the active zone 67 of the Hall element 3. In order to improve the long term stability of the Hall element 3, a blocking layer is located between the active zone 67 of the Hall element 3 and the surface of the Hall element 3. This blocking layer covers at least the active zone 67 of the Hall element 3. Preferably, the blocking layer is formed at least in part by a surface layer 68 located at the surface of the Hall element 3. The surface layer 68 is of a conductivity type the opposite to that of the semi-conductor material 46 (i.e., P-type) and covers at least the active zone 67 at the top. The surface layer 68 is at the most as thick as the depth of the contact diffusion regions 51 through 55, so that the diffusion regions pass through the surface layer 68 totally and make a connection between the surface of the Hall element 3 and the semi-conductor material 46. The surface layer 68 has a connection R. In use, an electric voltage is applied to this connection R in such a manner that the P/N junction between the surface layer 68 and semi-conductor material 46 is reverse biased.

The contact diffusion regions 51 through 55 are, for example, rectangular and all have the same depth. In a preferred embodiment, the contact diffusion regions 51 and 55 of the two outer current electrodes 41 and 45 have the shape of a ring and surround contact diffusion regions 51a and 55a, respectively, of gate connections OL and OR, respectively. The contact diffusions 51a and 55a are heavily doped with impurity atoms and comprise material of an opposite conductivity type to that of the semi-conductor material 46. They thus comprise P+-material. Their depth is, for example, equal to the depth of the contact diffusion regions 51 through 55 and they are also rectangular. In this case, the contact diffusion regions 51 and 55 are preferably rectangular-ring-shaped.

Preferably, a relatively deeply diffused ring-like region 69 is present at the surface of the semi-conductor material 46. The region layer 69 surrounds at least the contact diffusion regions 52 through 54 of the center current electrode and sensor electrodes. The center of the ring-like region 69 is formed approximately by the contact diffusion region 53 of the center current electrode 43. The longitudinal axis of the ring-like region 69 runs approximately parallel to the connection line of the current and sensor electrodes 41 through 45. The depth of the region 69 is larger than the depth of the contact diffusion regions 51 through 55 of the current and sensor electrodes 41 through 45. The ring-like region 69 comprises material that has a conductivity type (i.e., P-type) opposite to the conductivity type of the semi-conductor material 46. Illustratively, the surface layer 68, is in contact with the region 69. The region 69 provides isolation for the active zone 67.

In an advantageous manner, a ring-like diffusion region 70 that is heavily doped with impurity atoms is present at the surface in the semi-conductor material 46. The diffusion layer 70 surrounds region 69. The diffusion layer 70 is of the same conductivity type N as the semi-conductor material 46. It thus oomprises of N+-material.

In use, the two outer current connections C'$_2$ and C''$_2$ are externally connected to each other. The center current connection C$_1$ on one hand and the inter-connected outer current connections C'$_2$ and C''$_2$ on the other hand form the two-poled supply current connection for the Hall element 3. The supply current i$_N$, for example, flows in the case of the center connection C$_1$ into the Hall element 3 and divides within the Hall element 3 into two equal halves. The two current halves i$_N$/2 then leave the Hall element 3 each by way of an outer current connection C'$_2$ and C''$_2$, respectively.

The Hall output voltage $\pm^U$H is (after it has, if desired, been amplified and filtered in the optional high pas amplifier 9) converted in the voltage/frequency converter 7 into a proportional pulse frequency. The high pass amplifier 9 comprises, for example, an amplifier (not shown) and a high pass filter (not shown) connected at the output of the amplifier. The voltage/frequency converter 7 comprises an integrator 14;C that includes the voltage/current converter 14 and the capacitor C. The monitoring and control device 16 is connected at the output side of the capacitor. In the first embodiment, the pole switch 4 and the switching apparatus 18 form a combined switch device 4;18, while in all other sub-embodiments of the second embodiment, the pole switches 4 and 15 and the switching apparatus 18 form a combined switch device 4;15;18. The combined switch devices 4;18 and 4;15;18, respectively, serve to periodically switch the intelligence signal, i.e., the Hall output voltage, and to switch the two signal sources that are present in order to compensate for the offset voltages produce internally in the arrangement. More particularly, the offset voltage of the voltage/current converter 14 is compensated.

In the following, the operation mode of the voltage/frequency transformer 7 will be described for both embodiments. The charge volume compensation method and the recharging method are preferable, when the demands for precision are high as, for example, in the case of measuring electric power, especially when used in static electricity meters. In the case of the charge volume compensation method, a current to be measured is integrated by an integrator. Whenever a certain integrator voltage is reached, a constant compensation charge is withdrawn from the integrator. A balance between the added and withdrawn charge occurs in which case the number of compensation charges per time unit is proportional to the current to be measured. The charge content of the individual compensation pulses represents a measuring constant and can be kept constant with simple measures and high precision. However, special measures are necessary to prevent the generation of pulses by the voltage/frequency converter when no input signal is present. In the case of the recharging method, the current to be measured is also integrated in an integrator. Whenever a certain upper threshold value and a certain lower threshold value of the integrator voltage is reached, the measuring current is switched and the integration direction is thus reversed. The number of rechargings per time unit is proportional to the current to be measured. The capacity of the integrator capacitor and the difference between the upper and the lower threshold value represent, in the case of the recharging method, measuring constants that are difficult to keep constant with the necessary long term stability. However, the generation of pulses by the voltage/frequency converter in the absence of an input signal is prevented automatically. Above all, independent error currents can be partially compensated by way of periodic polarity switches by a polarity switch, when such a voltage/frequency converter is used in a static electricity meter. Thus, the measuring range can be increased.

In the first embodiment, the advantages of the charge compensation method and the recharge method are combined and thus, a voltage/frequency converter 7 is realized, whose measuring constant is given by the charge content of compensation pulses and where error currents are being compensated and wherein means are provided to prevent the generation of output pulses in the absence of an input signal.

In the first embodiment, the addition element 13 and the pole switch 15 are not present, as already mentioned. In this case, the voltage/current converter 14 is the input element of the voltage/frequency converter 7. The voltage/current converter 14 transforms the Hall output voltage $\pm^U$H (which, if desired, is amplified by the high pass amplifier 9) into a proportional current $\pm i_H$ that charges or discharges the capacitor C. In the first embodiment, the monitoring and control device 16 and the switch apparatus 18 have the construction illustrated in FIGS. 7 and 3, as already mentioned. The two signal sources 19 and 20 are, in the first embodiment, both constant current sources that supply reference currents I$_R$ and $-$I$_R$, respectively, that are equal but of opposite polarity.

Figure 7:
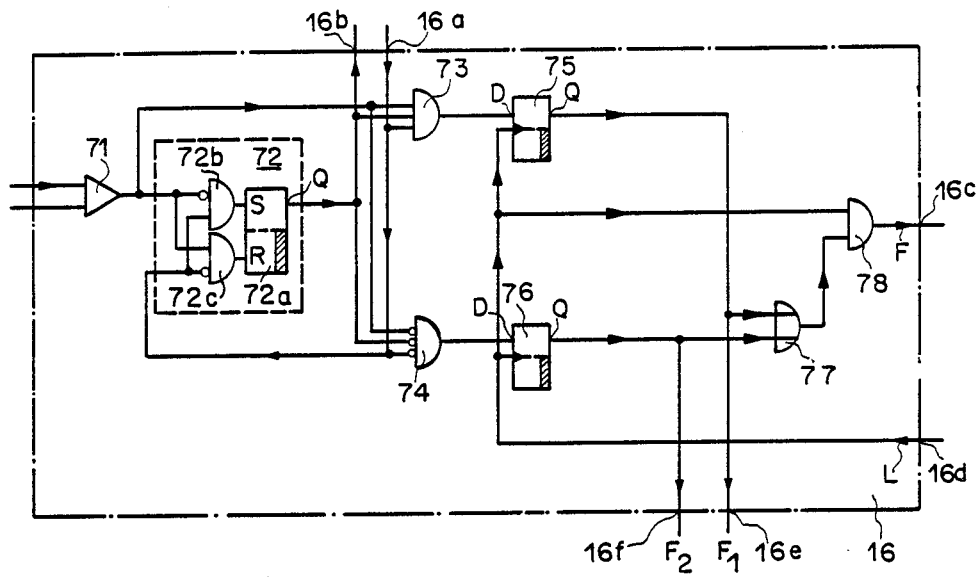
FIG. 7 shows a diagram of a first embodiment of a monitoring and control device.

In accordance to FIG. 7, the monitoring and control device 16 comprises a comparator 71, a stage 72, a first And-gate 73, a second And-gate 74, a first D-flip-flop 75, a second D-flip-flop 76, an Or-gate 77 and a third And-gate 78. The stage 72 itself comprises a RS-flip-flop 72a and two input-gates 72b and 72c that are locked against each other and that are connected in such a manner that a logic value "1" can never appear simultaneously at the two inputs of the RS-flip-flop 72a. The input-gates 72b and 72c are And-gates with one inverting input.

The two inputs of the comparator 71 form a two-poled input of the monitoring and control device 16. The output of the of the comparator 71 is led to a first input of the stage 72 and to first inputs of the gates 73 and 74. The output of the stage 72 is connected to a second input of the And-gates 73 and 74 and to the auxiliary control output 16*b* of the monitoring and control device 16. The control input 16*a* of said monitoring and control device 16 is led to a third input of the And-gates 73 and 74 and to a second input of the stage 72. All three inputs of the And-gate 73 are non-inverting and all three inputs of the And-gate 74 are inverting. Within the stage 72, its first input is connected to a first input of the input gates 72*b* and 72*c* and its second input is connected to a second input of the input gates 72*b* and 72*c*. The first input of the input gate 72*c* and the second input of the input gate 72*b* are inverting inputs. The output of the input gate 72*b* is led to a reset input and the output of the input gate 72*c* is led to a set input of the RS-flip-flop 72*a*. The Q-output of said RS-flip-flop 72*a* forms the output of the stage 72. The output of the And-gate 73 and of the And-gate 74 are each led to a D-input of the D-flip-flops 75 and 76, respectively. The Q-output of the D-flip-flop 75 is connected to a first input of the Or-gate 77 and the control output 16*e* of the monitoring and control device 16, while the Q-output of the D-flip-flop 76 is led to a second input of the Or-gate 77 and to a control output 16*f* of the monitoring and control device 16. The periodic input 16*d* of the monitoring and control device 16 is connected to the periodic (i.e., clock) inputs of the D-flip-flops 75 and 76 and to a first input of the And-gate 78. The output of the Or-gate 77 is led to a second input of the And-gate 78. The output of this And-gate forms the signal output 16*c* of the monitoring and control device 16.

The capacitor voltage $u_C$ of the capacitor C (see FIG. 1) is monitored by the comparator 71 incorporated in the monitoring and control device 16. This comparator 71 serves, on one hand, in known manner to trigger the charge compensation pulse and, on the other hand, as a component of a control circuit 71;72 for the switch signals A or B. The output of the stage 72 leads the switch signal A or B to the auxiliary control output 16*b* and thus to the control input of the pole switch 4 (see FIG. 1). The output signal of the And-gate 73 triggers positive charge pulses and the output signal of the And-gate 74 triggers negative charge pulses through use of the D-flip-flops 75 and 76, respectively. The D-flip-flops 75 and 76 serve for synchronization of the output signal of the And-gates 73 and 74 with the periodic signal L that reaches the periodic (i.e., clock) inputs of the D-flip-flops 75 and 76 from the frequency divider 22 (see FIG. 1) the periodic (i.e., clock) input 16*d*. At the Q-outputs of the D-flip-flops 75 and 76, respectively, control signals $F_1$ and $F_2$ originate for controlling the switches 31 and 32, respectively, of the switch apparatus 18 (see FIG. 3) by way of the control outputs 16*e* and 16*f*, respectively. Thus, the signal sources 19 and 20, respectively, (see FIG. 1) are switched on. The signal source 19 supplies a positive reference current $I_R$ to the capacitor C and the signal source 20 supplies a negative reference current $-I_R$ to the capacitor C. The And-gate 78 is a pulse former that limits the duration of the output pulse of the Or-gate 77 to the duration of the pulse of the periodic signal L (see FIG. 7).

The switch signals A and B, respectively, that occur at the auxiliary control output 16*b* of the monitoring and control device 16 switch the pole switch 4 periodically. During the odd half periods, the current that is proportional to the Hall output voltage is then positive and during even half periods it is negative. The integrator 14;C may be constructed as a Miller-integrator. In this case, the voltage/current converter 14 comprises an operational amplifier and a resistor connected to the inverting input of this amplifier. The grounded connection of the capacitor C is connected to the inverting input of the operation amplifier and is thus not directly but only virtually grounded. In this arrangement, the integrator 14;C integrates its input voltage and also inverts the integrated signal. As a result, for a negative current $-i_H$, the capacitor voltage $u_C$ increases for a short time during an odd half period of the switch signal A or B. The output signals of the comparator 71 and of the And-gate 73 show a logic value "1" until the next pulse of the periodic signal L tips the D-flip-flop 75, the switch 31 (see FIG. 3) closes and the positive signal source 19 is switched on. From this moment on, the capacitor voltage $u_C$ sinks as a result of the positive reference current $I_R$ that is dominating over the negative current $-i_H$. If the threshold value of the comparator 71 is not reached, the output signals of the comparator 71 and of the And-gate 73 go to the logic value "0" which, at first, has no further effect. The next pulse of the cycle signal L tips the D-flip-flop 75 back to its resting position and the signal source 19 is thus switched off. The switching on and off of the signal source 19 repeats itself successively during each odd-numbered half period of the switch signal A or B.

During the so far described operation sequence, output pulses were transmitted as signal F to the signal output 16*c* of the monitoring and control device 16 during the time of overlapping pulses of the signals L and $F_1$. During the next even-numbered half period of the switch signal A or B the first passing of the threshold value of the comparator 71 causes the stage 72 to tip, so that the switch signal A or B goes to a logic value "0" and so that the negative current $-i_H$ is switched to $i_H$, i.e., to become positive. At the same time, the And-gate 73 is being blocked and the blocked And-gate 74 is now being released. During the even-numbered half periods of the switch signal A or B the described sequence repeats itself, this time with a positive current $i_H$ and a negative reference current $-I_R$. The And-gate 74, the D-flip-flop 76 and the switch 32 (see FIG. 3) are not in use in this case.

The prepared switch signals A and B, respectively, the polarity of the current $\pm i_H$ and the reference current $\pm I_R$ always switch their values at the same magnitude of the capacitor voltage $u_C$, s that after each half period of the switch signals A and B respectively there is a charge balance between the charges flowing out in from the current $\pm i_H$ and the charge flowing out in the reference current $\pm I_R$. This insures that by the polarity switch, no measuring error can happen because of charge loss. The polarity switch also causes an automatic suppression of output pulses in the absence of an input signal. This is, because the integrator 14;C is driven into saturation at least after the next polarity switching, when the current $\pm i_H$ sinks in the absolute value below the value of a polarity-independent error current. Because of the periodical polarity switching, the influence of an error current that is overlaying the current $\pm i_H$, for example caused by the offset voltage of the voltage/current converter 14, is compensated in the output frequency of the voltage/frequency converter 7.

In the first embodiment, the integration of the offset voltage of the voltage/current converter 14 results in the value zero over an integral number of periods of the switoh signal A and B, respectively, only under the condition that both half periods of the switch signal A and B, respectively, last equally long. In the first embodiment, this is the case only in the statistic average. This results in an irregular modulation of the output frequency of the voltage/frequency converter 7. Also, the first embodiment is only usable when the intelligence signal $u_H$ is larger than the interference signal. In the case of the second embodiment, such a modulation is avoided, so that a fast and precise calibration of the arrangement is possible. The second embodiment is also usable when the intelligence signal $\pm u_H$ is smaller than the interference signal. In the second embodiment, the pole switch 15 that is being switched synchronously with the pole switch 4 is always present. In this embodiment, the monitoring and control device 16 has, as already mentioned, the construction illustrated in FIGS. 8 and 4, respectively. The first signal source 19 is arranged at the voltage/current converter 14 in such a manner than the input current of the pole switch 15 is always proportional to a sum signal, which equals the sum of a reference signal produced by the signal source 19 and the sum of a signal $\pm u_H$ or $\pm i_H$ that is proportional to the output signal of the Hall element 3. The value of this reference signal corresponds at least approximately to half the value of the reference current $I_R$ supplied by the signal source 20.

Figure 8:
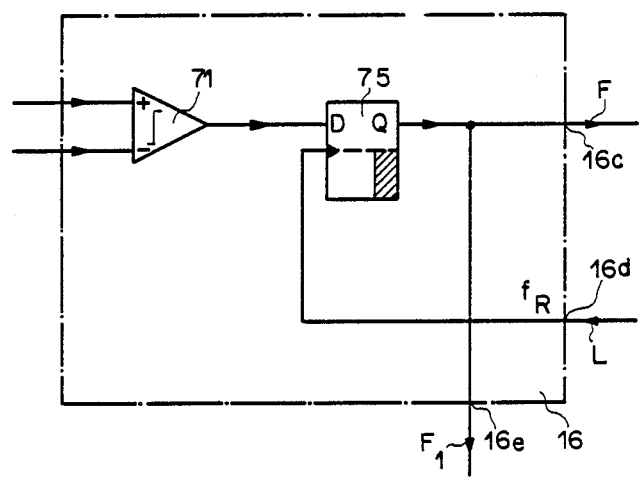
FIG. 8 shows a diagram of a second embodiment of a monitoring and control device.

In the second embodiment, the monitoring and control device 16 comprises the comparator 71 and the D-flip-flop 75 in accordance with FIG. 8. The two inputs of the comparator 71 form the two-pole input of the monitoring and control device 16. The output of the comparator 71 is led to the D-input of the D-flip-flop 75. The output of the D-flip-flop 75 forms the signal output 16c and the control output 16e of the monitoring and control device 16. The clock input of the monitoring and control device 16 itself is connected to the clock input of the D-flip-flop 75. The D-flip-flop 75 is, for example, controlled by negative (i.e., trailing) edges. Here, just as in the first embodiment, the capacitor voltage $u_C$ of the capacitor C (see FIG. 1) is monitored by the comparator 71 incorporated in the monitoring and control device 16.

In the first sub-embodiment of the second embodiment, the addition element 13 is not present, so that the voltage/current converter 14 again is the input element of the voltage/frequency converter 7 that converts the Hall output voltage $\pm u_H$ into a proportional current $\pm i_H$. The signal source 19 is, just as the signal source 20, a constant current source that, however, supplies a current $I_R/2$ instead of the reference current $I_R$. The reference signal produced by the signal source 19 is thus $I_R/2$. Because of the wiring, the current $I_R/2$ that is produced by the signal source 19 adds itself to the current at the output of the voltage/current converter 14, so that the input current of the pole switch 15 equals the sum signal $\pm i_H + I_R/2$.

In the second and third sub-embodiments of the second embodiment, the addition element 13 is each time present, so that the addition element 13 forms the input element of the voltage/frequency converter 7. In these two sub-embodiments, the signal source 19 is a voltage source that each time is connected, over the addition element 13, to the input of the voltage/current converter 14. In the second sub-embodiment, the signal source 19 has a constant voltage $U_R/2$ as reference signal that is added to the Hall output voltage $\pm u_H$ in the addition element 13 for the formation of the sum signal $\pm u_H + U_R/2$. This sum signal is then transformed by the voltage/current converter 14 into a proportional current $\pm i_H + I_R/2$ that, at the same time, is the input current of the pole switch 15. In the third sub-embodiment, the signal source 19 has an output voltage $U_R/2 - U_o$ of the circuit combination 27;28;29;30 (see FIG. 2) as reference signal that again is added to the Hall output voltage $\pm u_H$ in the addition element 13 for the formation of the sum signal $\pm u_H + U_R/2 - U_o$. The voltage/current converter 14 then transforms this sum signal into a proportional current $\pm i_H + I_R/2 - I_o$. The reference signals $U_R/2$ and $U_R/2 - U_o$, in which $U^o$ represents the offset voltage of the voltage/current converter 14, correspond at least approximately to the half value $I_R/2$ of the reference current $I_R$ of the signal source 20. The pole switch 15 that is arranged in all three sub-embodiments of the second embodiment between the voltage/current converter 14 and the capacitor C then switches the current $\pm i_H + I_R/2$ or $\pm i_H + I_R/2 - I_o$, respectively, synchronously with the periodical switching of the signal $u_H$, so that the capacitor C is supplied with a current $i_H \pm I_R/2$ or $i_H \pm I_R/2 \pm I_o$ from the pole switch 15. This current is then integrated at the capacitor. Since the voltage/current converter 14 normally has at its input an offset voltage $U_o$ (at the output of the voltage/current converter 14 the proportional current $I_o$ corresponds to this offset voltage $U_o$), the input current of the pole switch 15 is in reality not ideally equal to $\pm i_H + I_R/2$ but, in the two first sub-embodiments, equal to $\pm i_H + I_R/2 \pm I_o$ and in the third sub-embodiment $\pm i_H + I_R/2 + I_o - I_o = \pm i_H + I_R/2$.

The value of the reference signal $U_R/2$ and $I_R/2$ respectively corresponds to the half value of the reference current $I_R$ supplied by the signal source 20 and must fulfill the condition $U_R/2 > |\pm u_H + U_o|$ and $I_R/2 > |\pm i_H + I_o|$. In other words: The value of the constant reference signal $U_R/2$ and $I_R/2$ respectively is to be chosen to be larger than the value of the amplitude $u_H$ and $i_H$ respectively of the periodically switched signal $\pm u_H$ and $\pm i_H$ respectively, this value being increased by the influence $U_o$ and $I_o$ respectively of the offset voltage $U_o$.

The value of the offset voltage $U_o$ is normally very small, compared to the value of the signal $u_H$. The value of the current $I_o$ is normally very small compared to the value of the current $i_H$, so that only a small part of the operating range of the apparatus is occupied by the current $I_o$. In certain uses, when the maximum value of the signal $u_H$ is very small compared to the offset voltage $U_o$, the operating range that is left for the signal $u_H$ can become intolerably small compared to the operating range occupied by $U_R/2$ and $I_R/2$. This is why it is of advantage in the two first sub-embodiments to amplify the periodically switched signal $\pm u_H$ in the high pass amplifier 9, before it is led to the voltage/frequency converter 7 for further processing. By this, the relation of the signal current $i_H$ to the current $I_o$ and of the signal $u_H$ to the offset voltage $U_o$ is improved. The high pass amplifier 9 provides no or very little direct voltage amplification which is, for example, realized by the presence of a high pass filter in the high pass amplifier 9. The time constant of the high pass amplifier 9 must be chosen to be small enough in order for the amplified rectangular signal $\pm u_H$ to be transmitted with little distortion.

The comparator 71 monitors the capacitor voltage $u_C$ with the purpose of controlling the switching on and off of the constant reference current $I_R$ supplied by the signal source 20 when a threshold value is passed or fallen below. The temporal course of the capacitor voltage $u_C$ is illustrated in the second line of FIG. 9 for the case that the signal $u_H$ is constant and positive and the offset voltage $U_o$ equals zero. In this case, the capacitor voltage $u_C$ has a saw-tooth shape. The edges of this saw-tooth curve all have a constant inclination. The positive edges are parallel to each other and the negative edges are parallel to each other.

The switch 33 (see FIG. 4) that is controlled by the D-flip-flop 75 (see FIG. 8) serves for the switching on and off of the reference current $I_R$. As previously indicated, in the two first sub-embodiments, a current $i_H \pm I_R/2 \pm I_O$ is supplied to the capacitor C from the pole switch 15. In this case, the plus sign refers to odd numbered half periods of the switch signal A and B, respectively, and the minus sign refers to the even numbered half periods. If, at the beginning, the output signal F of the D-flip-flop 75 has a logic value "0", then the switch 33 takes, the position illustrated in FIG. 4. Then, during the odd half periods of the switch signal A or B, (i.e., during those half periods the pole switch 15 takes the position illustrated in FIG. 1) the signal source 20 is momentarily connected only with the grounded connection of the pole switch 15. The reference current $I_R$ of the signal source 20 flows into the ground and cannot charge the capacitor C. During each odd numbered half period of the switch signal A or B, the capacitor C is thus charged from the pole switch 15 with the current $i_H + I_R/2 + I_O$. By this, the voltage $u_C$ monitored by the comparator 71 increases at the capacitor C. The comparator 71 has, for example, an input threshold value of 0 volt. If the voltage $u_C$ passes the input threshold value of the comparator 71, then the comparator output signal K changes its value from the logic value "0" to the logic value "1". The temporal course of the output signal K of the comparator 71 is illustrated in the third line of FIG. 9. The change of state of the output signal K is entered into the D-flip-flop 75 connected at the output of the comparator 71 with the next negative (i.e., trailing) edge of the high frequency periodic signal L. The D-flip-flop 75 serves to synchronize the rectangular output signal K of the comparator 71 with the rectangular cycle signal L. The frequency of the periodic signal L is, as already mentioned, for example $2^{10}$ Hz. The temporal course of the signal L is illustrated in the first line and the temporal course of the rectangular output signal F of the D-flip-flop 75 is illustrated in the fourth line of FIG. 9. The change of value that is accepted by the D-flip-flop 75 controls the switch 33 through use of the output signal $F_1$ that is located at the control output 16e of the monitoring and control device 16. The signal $F_1$ equals the output signal F. Also, the change of value that is accepted by the D-flip-flop 75 switches the switch 33 so that it now takes the position opposite to the one illustrated in FIG. 4. By this, the reference current $I_R$ of the signal source 20 now in addition flows through the capacitor C.

The charge current of the capacitor C thus equals: $i_H + I_R/2 + I_O - I_R = i_H - I_R/2 + I_O$, i.e., the term $I_R/2$ has changed its sign. Since, as already mentioned, the condition $I_R/2 > |i_H + I_O|$ applies, the resulting charge current is negative.

The voltage $u_C$ at the capacitor C decreases and, when it falls below the input threshold value of the comparator 71, its output signal K then takes back its original logic value "0". This change of value as well is accepted into the D-flip-flop 75 with the next negative edge of the cycle signal L. This results in the switch 33 taking back its original position so that a new cycle can begin. This repeats itself until the odd numbered half period of the switch signal A or B is completed. Each pulse of the signals F and $F_1$ corresponds to a single discharge of the capacitor C that is performed through use of the reference current $I_R$.

We now consider even half periods of the switching signal A or B. At the end of each odd numbered half period of the switch signal A or B, the two-pole switches 4 and 15 are switched synchronously by the switch signal A or B, so that they both take a position opposite to the one illustrated in FIG. 1. By the switching of the pole switch 15, the capacitor C and the influence of the signal source 20 are switched. This time, in the position illustrated in FIG. 4, the signal source 20 is connected so that the capacitor C is charged. Assume that at the beginning of the even numbered half period of the switch signal A or B, the switch 33 takes, for example, the position illustrated in FIG. 4. In this case, the capacitor C is charged from the pole switch 15 with the current $i_H - I_R/2 - I_O$ and also from the signal source 20 with the reference current $I_R$. The total charge current is thus: $i_H - I_R/2 - I_O + I_R = i_H + I_R/2 - I_O$.

The capacitor voltage $u_C$ increases and, when it passes the input threshold value of the comparator 71, its output signal K changes its value from the logic value "0" to the logic value "1". This change of value results in the switch 33 being switched and thus in the signal source 20 being connected to the grounded connection of the capacitor C. The capacitor C is now charged from the pole switch 15 with the current $i_H - I_R/2 - I_O$ that is negative, since the condition $i_R/2 > |\pm I_H + I_O|$ applies. The capacitor voltage $u_C$ decreases and, when it falls below the input threshold value of the comparator 71, then its output signal changed its value back to the logic value "0". By this, the switch 33 is switched back in its original position so that a new cycle can begin. This repeats itself until the even numbered half period of the switch signal A or B, is finished.

Summarizing, the following applies:

During an odd numbered half period of the switch signal A or B, the capacitor C is alternatively charged with a current $i_H + I_R/2 + I_O$ and discharged with a current $i_H - I_R/2 + I_O$. During an even numbered half period of the switch signal A or B, the capacitor C is alternatively charged with a current $i_H + I_R/2 - I_O$ and discharged with a current $i_H - I_R/2 - I_O$. The two kinds of half periods thus differ only in the sign of the current $I_O$. Since the switch signals A and B have, because of the manner of their production, half periods of the same length and since the sign of the current $I_O$ is different in two successive half periods, $I_O$ eliminates itself and thus the influence of the offset voltage $U_O$ is eliminated by an integration over an integer number of periods of the switch signal A or B, or by an integration over a long enough time period.

The charge that constantly flows to the capacitor C during each odd half period through the current $i_H + I_R/2 + I_O$ from the pole switch 15 is successively withdrawn from it each time in small, constant, exactly defined charge quanta $Q_R = I_R/f_R$ by switching on the signal source 20. At the same time, one rectangular pulse per charge quantum is generated at the Q-output of the D-flip-flop 75 (see signal F in FIG. 9). The charge that is constantly withdrawn from the capacitor C during each even numbered half period by means of the current $i_H-I_R/2-I_O$ from the pole switch 15 is led successively back into the capacitor C in small, constant and exactly defined charge quanta $Q_R$ by way of switching on the signal source 20, so that the total charge current of the capacitor C corresponds to the current sum $(i_H-I_R/2-I_O)+I_R=i_H+I_R/2-I_O$. This time again, one rectangular pulse per quantum is generated at the Q-output of the D-flip-flop 75. Each of these pulses is thus a measure for the small, exactly defined charge quantum that is added to or withdrawn from the capacitor C through use of the reference current $I_R$. Depending on the switching of the capacitor C, the polarity of the charge current $i_H+I_R/2\pm I_O$ is unchanged. Thus, the charge that, at the time of the periodical switching of the switches 4 and 15, is still in the capacitor C is taken into account with the correct polarity, so that no modulation of the output frequency caused by the rest charge occurs.

It is desired to convert the output voltage of the Hall element to a proportional frequency. The output signal F of the D-flip-flop 75 that is produced with the help of the integration and the comparator 71 comprises rectangular pulses. The average frequency $f_F$ of these pulses is proportional to the current sum $i_H+I_R/2$ and is thus too large by a constant frequency $f_R/2$, where the frequency $f_R/2$ is the frequency that corresponds to the value of the reference signal $U_R/2$ or $I_R/2$. The frequency $f_R/2$ is also the frequency of the rectangular periodic signal P. In order to get an output frequency of the apparatus that is proportional only to the signal current $i_H$ and thus proportional only to the signal $u_H$, the constant reference frequency $f_R/2$ of the cycle signal P must be subtracted from the frequency $f_F$ of the output signal F. This happens through use of a forwards/backwards counter that exists in the form of an output frequency divider 17 at the output of the voltage/frequency converter 7 (see FIG. 1). The pulses of the output signal F of the D-flip-flop 75 are counted forwards and those of the periodic signal P are counted backwards. At the same time, the output frequency divider 17 divides the frequency difference $f_F-f_R/2$ by a number k. The construction of the output frequency divider 17 is illustrated in FIG. 10.

Figure 10:
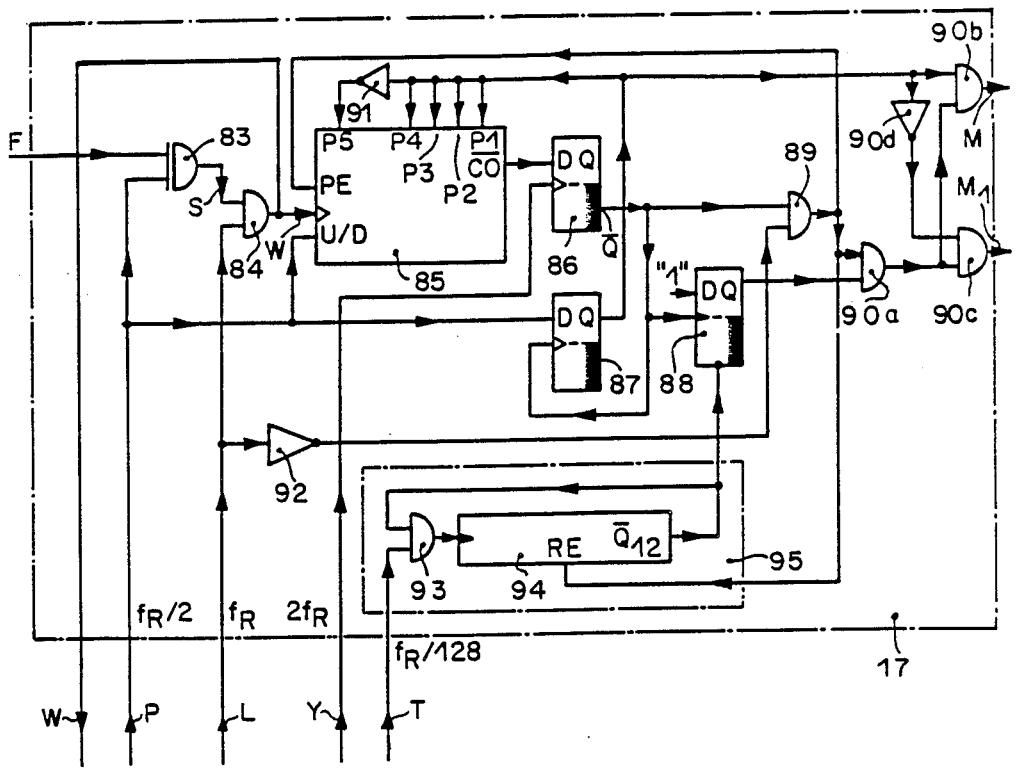
FIG. 10 shows a diagram of an output frequency divider.

The output frequency divider 17 illustrated in FIG. 10 comprises of an Exclusive-Or-gate 83, a first And-gate 84, a first counter 85, a first flip-flop 86, a second flip-flop 87, a third flip-flop 88, a second And-gate 89, a third And-gate 90a, a fourth And-gate 90b, a fifth And-gate 90c, a first invertor 90d, a second invertor 91, a third invertor 92, a sixth And-gate 93 and a second counter 94. The first counter 85 is a binary forwards/backwards counter that, for example, counts forwards when a logic value "1" is located at its U/D input and that counts backwards when a logic value "0" is located at its U/D input. All flip-flops 86 through 88 are for instance D-flip-flops. The And-gate 93 and the counter 94 together form a mono-stable multivibrator 95. The clock inputs of the counter 85, of the flip-flop 86 and of the flip-flop 87 are, for example, controlled by positive (i.e., leading) edges and the cycle inputs of the flip-flop 88 and of the counter 94 are, for example, controlled by negative (i.e. trailing) edges. The flip-flop 88, the And-gate 90a and the mono-stable multivibrator 95 form a neutral-prevention circuit 88;90a;95 that is of special importance when the apparatus is used in an electricity meter.

The first signal input of the output frequency divider 17 is the signal F. The signal F is connected to a first input of the Exclusive-Or-gate 83. The second signal input is the periodic signal P. The signal P with frequency $f_R/2$ is led to a second input of the Exclusive-Or-gate 83, to the U/D input of the counter 85 and to a D-input of the flip-flop 87. The first periodic input of the output frequency divider 17 is the signal L of frequency $f_R$. The signal L is connected to a first input of the And-gate 84 and by way of an invertor 92 to a first input of the And-gate 89. The second periodic input is the signal T with a frequency $f_R/128$. The signal T is led to a first input of the And-gate 93. Its third periodic input is connected to the clock input of the flip-flop 86 and is formed by the periodic signal Y with the frequency $2f_R$.

Interconnected are:

The output of the Exclusive-Or-gate 83 to a second input of the And-gate 84, the output of which is led to a clock input of the counter 85, the "carry out" output $\overline{CO}$ of the counter 85 is connected to a D-input of the flip-flop 86, the $\overline{Q}$-output of which is led to a second input of the And-gate 89, to a periodic (i.e., clock) input of the flip-flop 87 and to a periodic (i.e., clock) input of the flip-flop 88, the output of the And-gate 89 is connected to a first input of the And-gate 90a, to the input PE of the counter 85 and to the set-back (i.e., reset) input RE of the counter 94, the Q-output of the flip-flop 87 is connected to the parallel inputs P1 through P4 of the counter 85, to the first input of the And-gate 90b and by way of the invertor 91 to the input P5 of the counter 85 and by way of the invertor 90d to the first input of the And-gate 90c, the Q-output of the flip-flop 88 is connected to a second input of the And-gate 90a, the output of which is led to a second input of the And-gate 90b and 90c and the output of the And-gate 93 is connected to a clock input of the counter 94, the Q12-output of which is led to a second input of the And-gate 93 and to an inverting set back input of the flip-flop 88.

A logic value "1" is present at the D-input of the flip-flop 88. The outputs of the And-gates 90b and 90c form the two outputs of the output frequency divider 17, where the signals M and $M_1$ are located.

Since the counter 85 cannot count forwards and backwards at the same time, all pulses of the output signal F and of the signal P that appear simultaneously at the two signal outputs of the output frequency divider 17 are eliminated through use of the Exclusive-Or-gate 83. This does not have any negative influence on the count value of the counter 85, since a pulse that is counted forwards and backwards would result in a zero count value anyway.

Figure 9:
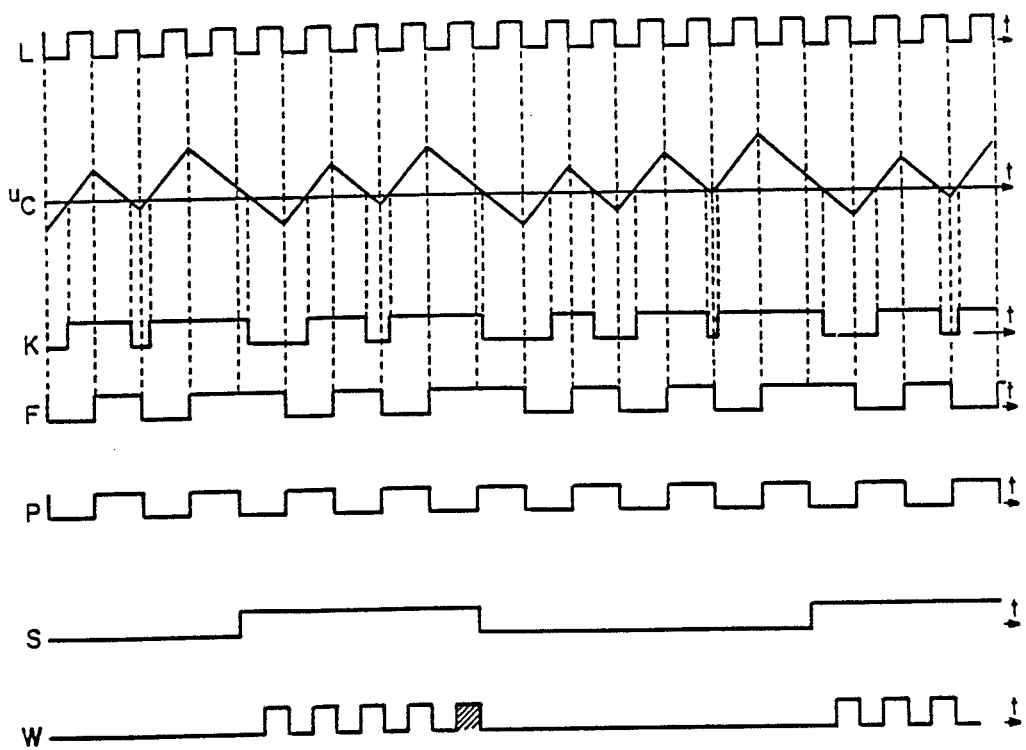
FIG. 9 shows pulse diagrams that belong to the second embodiment.

A logic value "1" appears at the output of the Exclusive-Or-gate 83 only when the two signals F and P are different. The And-gate 84 serves as pulse generator that reduces the duration of the output pulses of the Exclusive-Or-gate 83 to the duration of the pulses of the signal L. In FIG. 9, the temporal course of the cycle signal P is illustrated in the fifth line, the output signal S of the Exclusive-Or-gate 83 in the sixth line and the output signal W of the And-gate 84 in the seventh line. The counter 85 counts the output pulses of the And-gate 84 forwards when the signal P that is located at its U/D-input has a logic value "1" and backwards when the signal P has a logic value "0". The negative pulses at the output $\overline{CO}$ of the counter 85 are transmitted with the next leading edge of the signal Y into the flip-flop 86 and thus normally appear slightly delayed as positive pulses at the Q-output of the flip-flop 86. Their duration is with the hel of the inverted periodic signal L in the following And-gate 89 limited to the duration of the pulses of the cycle signal L, i.e., the And-gate 89 also works as a pulse generator. Because of static or the temporary alternating polarity of the signal $u_H$, the count direction can change. The initial count value of the counter 85 is not chosen to be, as usual, 0=00000, when counting forwards, or to be the maximum value 31=11111 when counting backwards, but it is set to be approximately in the middle of the count range, i.e., for example, at a value 16=10000, if the state 00000 had been reached earlier when counting backwards (P="0") or at a value 15=01111 when a state 11111 had been reached earlier when counting forwards (P="1"). This happens, when, with each positive edge of the output pulse of the flip-flop 26, the just existing logic value of the signal P is taken over into the flip-flop 27. Thus, to initialize the oounter 25, the Q-output of the flip-flop 87 applies a binary number 10000=16 when P="0" or a binary number 01111=15 when P="1" to the parallel inputs P5, P4, P3, P2, P1 of the counter 85. Each output pulse of the And-gate 89 serves to set this initial value into the counter 85 through use of the input PE and at the same time sets back the counter 94 to zero through use of the set back input RE. This setting process of the counter 85 permits a logic value "1" to appear anew at the output CO of the counter 85. The logic value "7" is normally, slightly delayed, taken over into the flip-flop 86. This ends the positive pulse at its $\overline{Q}$-output. By this, the output pulse of the And-gate 89 also ends. If the flip-flop 88 was still set with a logic value "1", then this is caused by the negative edges of the output pulses at the $\overline{Q}$-output of the flip-flop 86. By this, the Q-output of the flip-flop 88 releases the And-gate 90a. But because, at the same time, as already mentioned, the output pulse of the And-gate 89 ends, this output pulse does not reach the outputs of the output frequency divider 17, because the And-gate 90a is released too late for it. The setting back of the counter 94 by the output pulse of the And-gate 89 causes the $\overline{Q}_{12}$-output of the counter 94 to take a logic value "1" that releases the And-gate 93. As soon as the output pulse of the And-gate 89 is ended, the counter 94 begins to count the pulses of the periodic rectangular signal T. If the counter 94 is not set back to zero in the meantime by an output pulse of the And-gate 89, then it counts until a logic value "0" appears at its $\overline{Q}_{12}$-output that, on one hand, sets back the flip-flop 88 to zero and, on the other hand, blocks the And-gate 93 and thus ends the count process of the counter 94. A logic value "0" appears at the $\overline{Q}_{12}$-output of the counter 94 after $2^{12-1}=2^{11}$ periods of duration $128/f_R$ of the signal T, i.e., after $2^{18}/f_R$ seconds, which results, with $f_R=2^{10}$ Hz, in a duration of $2^8=256$ seconds When t is longer than 256 seconds, the neutral prevention circuit 88;90a;95 prevents a pulse appearing at the output $\overline{CO}$ of the counter 85 from being transmitted to the outputs of the output frequency divider 17. Since, after 256 seconds, the flip-flop 88 is set back to zero by the output signal of the counter 94, the And-gate 90a is blocked for each first pulse. In the case of normal usage, when a signal $u_H$ is located at the input of the apparatus, the first positive pulse appearing at the $\overline{Q}$-output of the flip-flop 86 is not transmitted to the outputs of the output frequency divider 17 (initial error) but its negative edge sets a logic value "1" into the flip-flop 88. The Q-output of the flip-flop 88 thus releases the And-gate 90a, i.e., for all following pulses. The latter is caused by the fact that each new output pulse of the And-gate 89 sets the counter 94 back to zero before 256 seconds pass. By this, the counter 94 is each time forced again, to begin its count process with zero, so that a logic value "0" never appears at its $\overline{Q}_{12}$-output and the flip-flop 88 is never set back to zero. The release of the And-gate 90a lasts until no more pulses appear before 256 seconds pass. The center frequency of the output pulses of the counter 85, of the flip-flop 86, of the And-gate 89 and of the And-gate 90a is in this case proportional to the signal current $i_H$ and thus proportional to the signal $u_H$.

However, in the neutral condition, when no signal $u_H$ is located at the input of the apparatus, it is possible that the integration of very small interference signals over a very long time will produce a pulse at the output of the And-gate 89. As any first pulse, this pulse does not reach the outputs of the output frequency divider 17 because the And-gate 90a is blocked. All other neutral pulses do not reach these outputs either, since their intervals relative to each other and to the first pulse are always larger than 256 seconds, i.e., each time, before the counter 94 is set back to zero by the pulse, it has enough time to let a logic value "0" appear at its $\overline{Q}_{12}$-output. This logic value "0" sets the flip-flop 88 back to zero each time and thus blocks the And-gate 90a in time before the appearance of the next pulse.

The output signal of the flip-flop 87 indicates which polarity the signal $u_H$ has. In case of positive values of the signal $u_H$, it releases the And-gate 90b, so that the output signal of the And-gate 90a reaches the output of the And-gate 90b as signal M. In case of negative values of the signal $u_H$ however, it releases the And-gate 90c, so that the output signal of the And-gate 90a reaches the output of the And-gate 90c as signal $M_1$ this time. The signal M corresponds to a positive value and the signal $M_1$ corresponds to a negative value.

Figure 11:
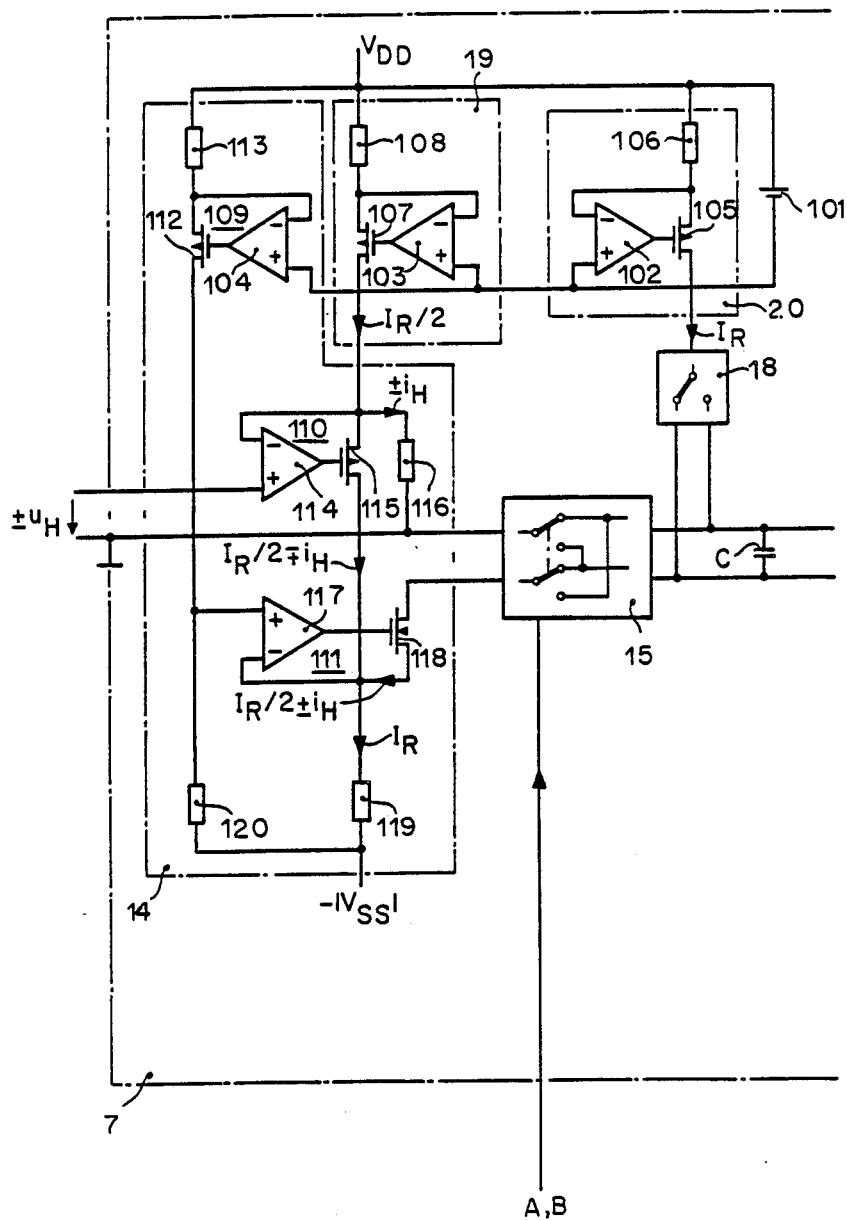
FIG. 11 shows a diagram of an input part of a voltage/frequency converter.

For the first sub-embodiment of the second embodiment, a preferred integrated embodiment of the input part of the voltage/frequency converter 7 is illustrated in FIG. 11. Especially the construction of the voltage/current converter 14 and of the signal sources 19 and 20 is illustrated in detail, while the rest of the input part is only indicated. The two signal sources 19 and 20 that are constant current sources and the current sources incorporated in the voltage/current converter 14 each comprise an operational amplifier, a field effect transistor and at least one resistor. The value of the resistor determines the value of the output current of the current source. The construction of such precision current sources is described in the book *Advanced Electronic Circuits*, Tietze and Schenk, Springer Verlag, 1978, pages 57 through 63. Three of the constant current sources used in FIG. 11 need a shared constant voltage source 101 of, for example, 1.235 volt. The positive pole of this shared constant voltage source is connected to the positive direct current supply voltage $V_{DD}$ and the negative pole of the constant voltage source is connected to a non-inverting input of the three operational amplifiers 102, 103 and 104. The constant current source 20 comprises an operational amplifier 102 whose output is connected to a gate-connection of a field effect transistor 105, while a second connection of the field effect transistor 105 is directly connected with the inverting input of the operational amplifier 102 and by way of a resistor 106 to the positive direct current supply voltage $V_{DD}$. A third connection of the field effect transistor 105 forms the output of the constant current source 20 and supplies the reference current $I_R$. The output of the constant current source 20 is, by way of the circuit apparatus 18, led to an output pole of the pole switch 15 and to a pole of the capacitor C.

The constant current source 19 comprises the operational amplifier 103, a field effect transistor 107 and a resistor 108. The voltage/current converter 14 comprises a constant current source 109 and two current sources 110 and 111. The constant current source 109 comprises the operational amplifier 104, a field effect transistor 112 and a resistor 113. The current source 110 is composed of an operational amplifier 114, a field effect transistor 115 and a resistor 116, while the current source 111 comprises an operational amplifier 117, a field effect transistor 118 and a resistor 119. The arrangement of all current sources 19, 109, 110 and 111 is identical to the arrangement of the constant current source 20. However, the second connection of the field effect transistor 115 is not connected to the positive direct current supply voltage $V_{DD}$ but to the ground and the field effect transistor 118 is not connected to the positive direct current supply voltage $V_{DD}$, but by way of the resistor 119 to the negative ydirect current supply voltage $-|V_{SS}|$. The input pole of the voltage/frequency converter 7 that is not grounded and the output of the constant current source 109 are led to a non-inverting input of the operational amplifiers 114 and 117, respectively. The non-inverting input of the operational amplifier 117 is also connected by way of a resistor 120 to the negative direct current supply voltage $-|V_{SS}|$. The output of the constant current source 19 supplies the half reference current $I_R/2$ and is connected to the inverting input of the operational amplifier 114, while the output of the current source 110 is led to the inverting input of the operational amplifier 117. The current source 110 works as a voltage/current converter that converts the signal $\pm u_H$ that is located as voltage into a proportional current $\pm i_H$ that flows in the resistor 116 and is subtracted in the field effect transistor 115 from the half reference current $I_R/2$ that is supplied by the constant current source 19. The current $I_R/2 \pm i_H$ at the output of the current source 110 is subtracted in the current source 111 from the reference current $I_R$ that flows in the resistor 119, so that at the output of the current source 111 and thus also at the output of the voltage/current converter 14, the demanded current $\pm i_H + I_R/2$ originates. The output of the current source 111 and the ground together form the two-pole output of the voltage/current converter 14 and are connected to the two-pole input of the pole switch 15.

The third sub-embodiment corresponds approximately to the second sub-embodiment, but the constant voltage source is replaced with a circuit 27;28;29;30 as the voltage source (see FIG. 2). The output voltage $U_R/2-U_0$ of the circuit 27;28;29;30 replaces the reference signal $I_R/2$ of the constant voltage source and is at the same time the reference voltage $U_R/2$ that is reduced by the offset voltage $U_0$ of the voltage/current converter 14.

In the second sub-embodiment, only the average value of the influence of the offset voltage $U_0$ on the output frequency of the device is eliminated. In the third sub-embodiment, however, an additional frequency modulation of the output signals M and $M_1$ of the voltage/frequency converter 7 caused by the offset voltage $U_0$ is eliminated. The forwards/backwards counter 28 (see FIG. 2) works in a manner similar to the counter 85 in the output frequency divider 17 (see FIG. 10). The difference is, that the count direction of the forwards/backwards counter 28 is, during the even numbered half periods, due to the presence of the Exclusive-Or gate 27, opposite to the count direction during the odd numbered half periods of the switch signal A or B. During an odd numbered half period, the count of the forwards/backwards counter results in a count value $(f_H+f_0)\cdot T/2$; during an even numbered half period it results in a count value $-(f_H-f_0)\cdot T/2$, so that during each whole period T of the switch signal A and B, respectively, a count value $(f_H+f_0)\cdot T/2 -(f_H-f_0)\cdot T/2=2f_0\cdot T/2 =f_0\cdot T$ is determined. In this process, $f_H$ is the component of the frequency $f_F$ that corresponds to the signal $u_H$ and $f_0$ is the component of the frequency $f_F$ that corresponds to the offset voltage $U_0$. The count value $f_0\cdot T$ is thus proportional to the offset voltage $U_0$. At the end of each period T this count value is set with the positive (i.e., leading) edge of the switch signal A or B into the accumulator 29 in order to be then transformed through use of the digital/analog converter 30 into an analog value. The analog value at the output of the digital/analog converter 30 equals $U_R/2-U_0$. The analog output of the digital/analog converter 30 is connected to the first input of the addition element 13. The output current of the voltage/current converter 14 is thus, as required, proportional to the sum voltage $\pm u_H+U_R/2-U_0+U_0=\pm u_H+U_R/2$. The second offset voltage $U_0$ is introduced by means of the voltage/current converter 14 into the circuit. Thus, ideally, in the output current of the voltage/current converter 14, no component of the offset voltage $U_0$ exists any longer.

Figure 12:
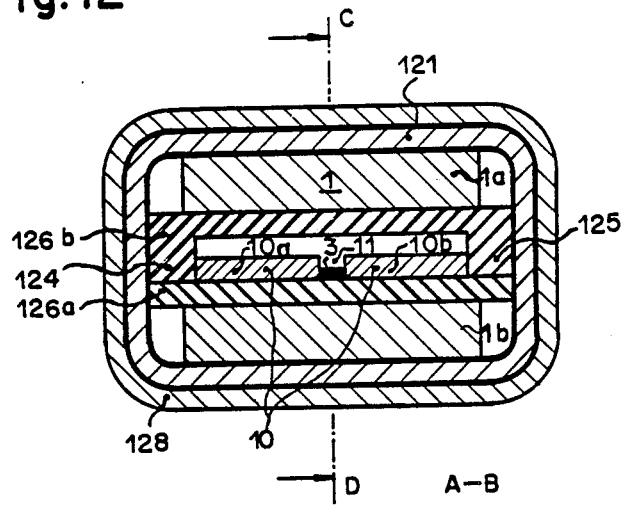
FIG. 12 shows a first cross-section A-B of the construction of a first embodiment of a measuring device.
Figure 13:
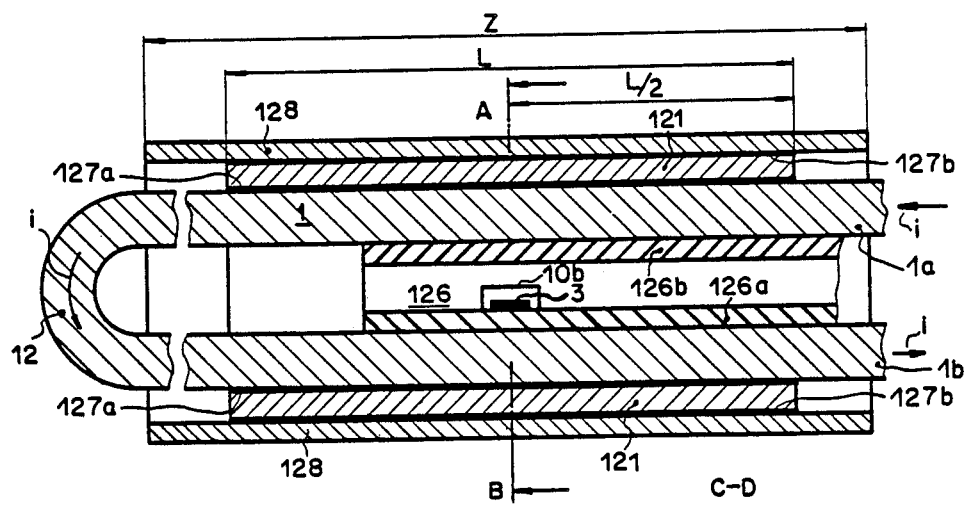
FIG. 13 shows a second cross-section C-D of the construction of the first embodiment of a measuring device.

The measuring device to measure the current i flowing in an electrical conductor 1 (see FIG. 1) is illustrated in FIGS. 12 and 13. The measuring device comprises the Hall element 3 and, the three-legged ferromagnetic core 2. The ferromagnetic core 2 preferably comprises a ring 121 and a center leg 10. The surfaces that in the drawing are the lower and the upper surface of the ring 121 form the two outer legs of the ferromagnetic core. The two side surfaces of the ring 121 form the yoke of the three-legged ferromagnetic core. The yoke connects the three legs at their ends. As material for the ferromagnetic core an iron-nickel alloy is suitable because of high permeability. Such alloys include, for example, permenorm, vacoperm, trafoperm, permax, ultraperm or mumetal. The center leg 10 has, for example, at least three air gaps 11, 124 and 125. Of those, the center air gap 11 contains the Hall element 3 and the two outer air gaps 124 and 125 are arranged at either of the two ends of the center leg 10. The length of the center air gap 11 measured in the direction of the arrows of FIG. 12 almost equals the width of the Hall element 3 measured in the same direction, so that the central air gap 11 is defined exactly by this width of the Hall element 3. Each of the two outer air gaps 124 and 125 is, when measured in the direction of the arrows of FIG. 12 (i.e., in the longitudinal direction of the leg 10), longer than the center air gap 11. The center leg 11 preferably comprises two flat sheet-metal strips 10a and 10b that, together with the Hall element 3, are arranged in a case 126 made out of non-ferromagnetic material, preferably ceramic material. The case 126 preferably has a floor 126a and a case top 126b. The center leg 10 and the Hall element 3 are preferably arranged on a carrier made out of insulation material where, for example, in addition, electronic elements are present. Preferably the floor 126 of the case 126 is this carrier. This permits a simple, precise and dependable installation of the Hall element 3 and of the center leg 10 that together form a unit. The two outer air gaps 124 and 125 are filled up each by a wall of the case 126, so that the length of these air gaps when measured in the direction of the arrows of FIG. 12 can be defined exactly by the thickness of the wall of the case 126. The ring 121 comprises at least a ring-shaped bent sheet which simplifies its production. The length L of the ring 121 (see FIG. 13) is larger than its largest internal dimension, so that it shields the Hall element 3 from the effects of external foreign magnetic fields $H_a$ very well. The electrical conductor 1 preferably has a rectangular cross-section and the ring 121 is also preferably rectangular. The center leg 10 is at least partially surrounded by the electrical conductor 1 and preferably arranged between an outgoing and an incoming conducting path 1a and 1b of the electrical conductor 1 that are parallel to each other. The electrical conductor 1 forms, for example, the U-shaped loop 12 (see FIG. 13), the outgoing and incoming conducting paths of which are the parallel outgoing and incoming conducting paths 1a and 1b of the electrical conductor 1. The rectangular cross-section of the electrical conductor measures, for example 2 mm by 10 mm for a current i of 100A. If a Hall element is used that measures magnetic fields that are oriented perpendicular to its surface, then the Hall element 3 fills, for example, the air gap 11 completely. However, if a Hall element is used that measures magnetic fields that are oriented parallel to its surface, then the Hall element 3 fills, for example, only the lower half (see FIG. 12) of the air gap 11. The length of the air gap 11 is, for example, 0.6 mm and the length of the other air gaps 124 and 125 is each, for example, 1.7 mm. On the carrier, additional electronic elements not illustrated here can be located within or outside of the case 126a; 126b, that are, for example, part of the electronics connected to the Hall element 3.

In FIG. 12 it was assumed that the width of the case 126 is larger than the width of the electrical conductor 1. In this embodiment, in the cross-sectional view of FIG. 12, the case 126 fills the space between the incoming and the outgoing conducting paths 1a and 1b of the loop 12 only partially. In all cases, the ring 121 of the length L (see FIG. 13) surrounds the incoming and outgoing conducting paths 1a and 1b of the loop 12 and the case 126 in such a manner that the center leg 10, measured parallel to the arrows of FIG. 13, is located approximately in the middle, a distance L/2 away from either edge of the ring 121 (see FIG. 13). The incoming and outgoing conducting paths 1a and 1b of the loop 12 cross the cavity between the case 126 and the ring 121, for example, in such a manner that, if possible, they touch the case 126a;126b and also touch, electrically insulated, the ring 121. Between the ring 121 on one hand and the incoming and outgoing conducting paths 1a and 1b of the loop 12 on the other hand, an insulating layer 127a is thus present (see FIG. 12 and FIG. 13).

The ring 121 is advantageously surrounded by an approximately parallel ring-shaped and outer shield 128. Between the ring 121 and the outer shield 128, an insulating layer 127b, for example, is present. The outer shield 128 has a length Z that is larger than the length L of the ring 121, so that the front and back ends of the ring 121 are partially shielded as well (see FIG. 13). The length Z is, for example, 30 mm. The outer shield 128 advantageously comprises a deep-drawn cold rolled steel or an iron-nickel alloy. The insulating layer 127b that is between the ring 121 and the outer shield 128 again serves to increase the space between the ring and the outer shield which improves the shielding effect of the outer shield 128. This space is, for example, 0.05 mm. The object of the outer shield 128 is to relieve the ring 121 that is highly-permeable but easy to saturate and also effective as a shield, when the external foreign magnetic fields $H_a$ are strong. The ring 121 and the outer shield 128 thus serve as a double shield. Without the outer shield 128, the shield formed by the ring 121 stays unsaturated up to a value of the external foreign magnetic $\overline{H}_a$ of approximately 50A/cm. When the double shield exists however, the shield formed by the ring 121 stays unsaturated up to a value of the external foreign magnetic field $\overline{H}_a$ of approximately 200A/cm.

When an iron-nickel alloy is used for the core 2 (i.e., the core 121;10) the decrease in magnetic tension in the ferromagnetic material can be neglected compared to the decrease in magnetic tension at the air gap 11 and the air gaps 11, 124 and 125, respectively. Accordingly, non-linearities, phase errors and the temperature coefficient of the highly-permeable material influence the measurement device insignificantly. The arrangement of the center leg 10 and the Hall element 3 on a carrier and/or in a case 126 allows an especially precise, simple and dependable installation of the measuring device. The use of three air gaps 11, 124 and 125 permits the concentration of tolerance problems of the air gap lengths in the two outer air gaps 124 and 125 where they disrupt the least since the magnetic flux lines in the two outer gaps are not packed in parallel and densely but are already partially separated as they make their way through the air space bordering the ferromagnetic core 2. These tolerance problems are smaller the stronger the divergence of the magnetic flux lines is, i.e., the longer the outer air gaps 124 and 125 are.

Figure 14:
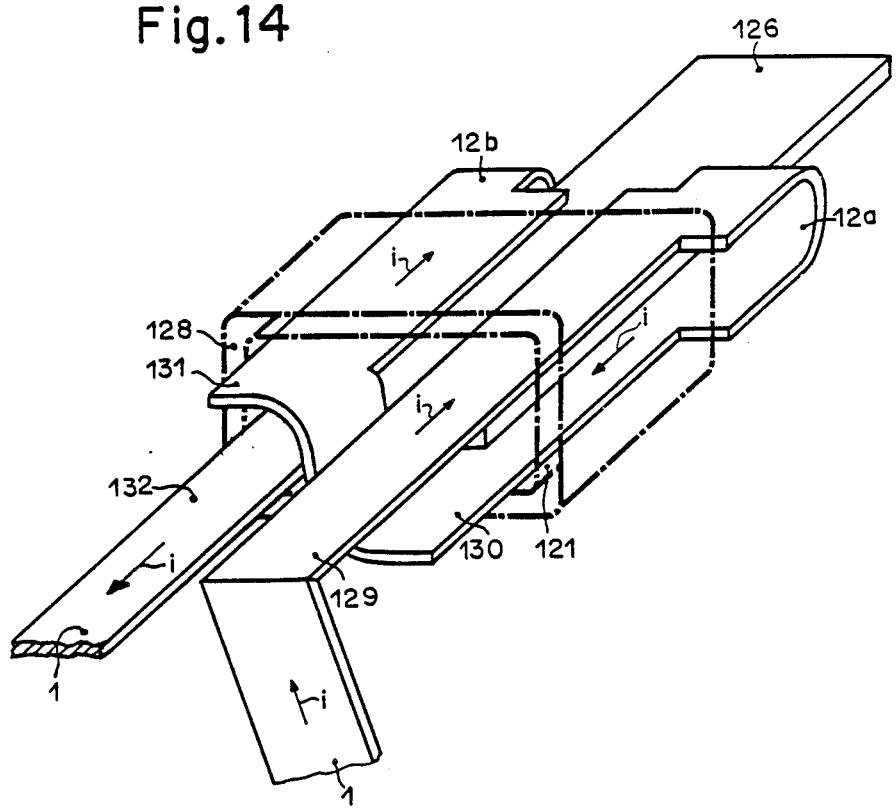
FIG. 14 shows an arrangement of a second embodiment of a measuring device.
Figure 15:
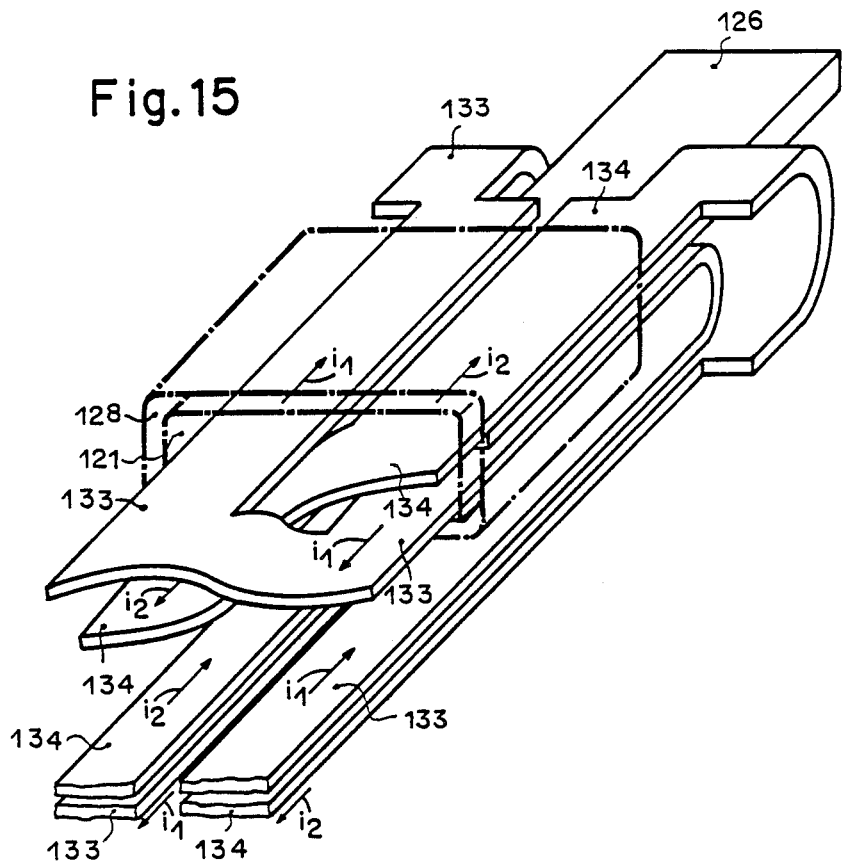
FIG. 15 shows an arrangement of a third embodiment of a measuring device.

Two alternative embodiments of measuring devices are shown in FIGS. 14 and 15. In the arrangement illustrated in FIG. 14, the electrical conductor 1 forms at least two U-shaped loops 12a and 12b that are arranged in parallel to one another and connected electrically in series. Both conductors 129, 130 and 131, 132, respectively, of each loop 12a and 12b, respectively, are arranged in parallel and on top of one another. The two outgoing conducting paths 129 and 131 on the one hand and the two incoming conducting paths 130 and 132 on the other hand of the two loops 12a and 12b are each arranged in the same plane next to one another. The case 126 and thus also the center leg 10 with the Hall element 3 are arranged between the two outgoing conducting paths 129 and 131 on one hand and the two incoming conducting paths 130 and 132 on the other hand. All these outgoing and incoming conducting paths are in the vicinity of the case 126. The ring 121 and, if existing, the outer shield 128 surround the two U-shaped loops 12a and 12b and are electrically insulated therefrom. The arrangement enables the excitation of the core 2 with a half current, for example 50A, without changing the configuration of the core 2 and the case 126. The half current produces an equally large magnetic field $\overline{H}$ with two loops 12a and 12b as the current i with a single loop 12.

Naturally, the U-shaped loops 12a and 12b can be arranged so that one loop slides into the other loop. In this case, the two outgoing conducting paths 129 and 131 on one hand and the two incoming conducting paths 130 and 132 on the other hand are arranged on top of one another instead of next to one another. The outgoing and incoming conducting paths 129 through 132 can then be approximately twice as wide and half as thick.

In the third embodiment illustrated in FIG. 15, the electrical conductor 1 comprises two conductors 133 and 134. The conductors 133 and 134 each traverse the ring 121 first in one direction, then the two conductors cross over and traverse the ring 121 again in the opposite direction. Within the ring 121, the two conductors 133 and 134 are parallel. At the intersection or crossover point, the two conductors are electrically insulated. The case 126 and the center leg 10 are arranged between the two conductors 133 and 134. The two conductors 133 and 134 are, for example, arranged parallel on top of one another. An outer shield 128 surrounds the ring 121. The above described arrangement is, for instance, used in electrical meters of the U.S.A. and permits excitation of the core 2 with two independent one-phase currents $i_1$ and $i_2$ of, for example, 200A each, without changing the configuration of the case 126 and of the ferromagnetic core 2. In an extreme case one of the two currents $i_1$ and $i_2$, respectively, may then equal zero. Such a construction of the conductors 133 and 134 allows the equalization of the transmission constants of the two currents $i_1$ and $i_2$.

Figure 16:
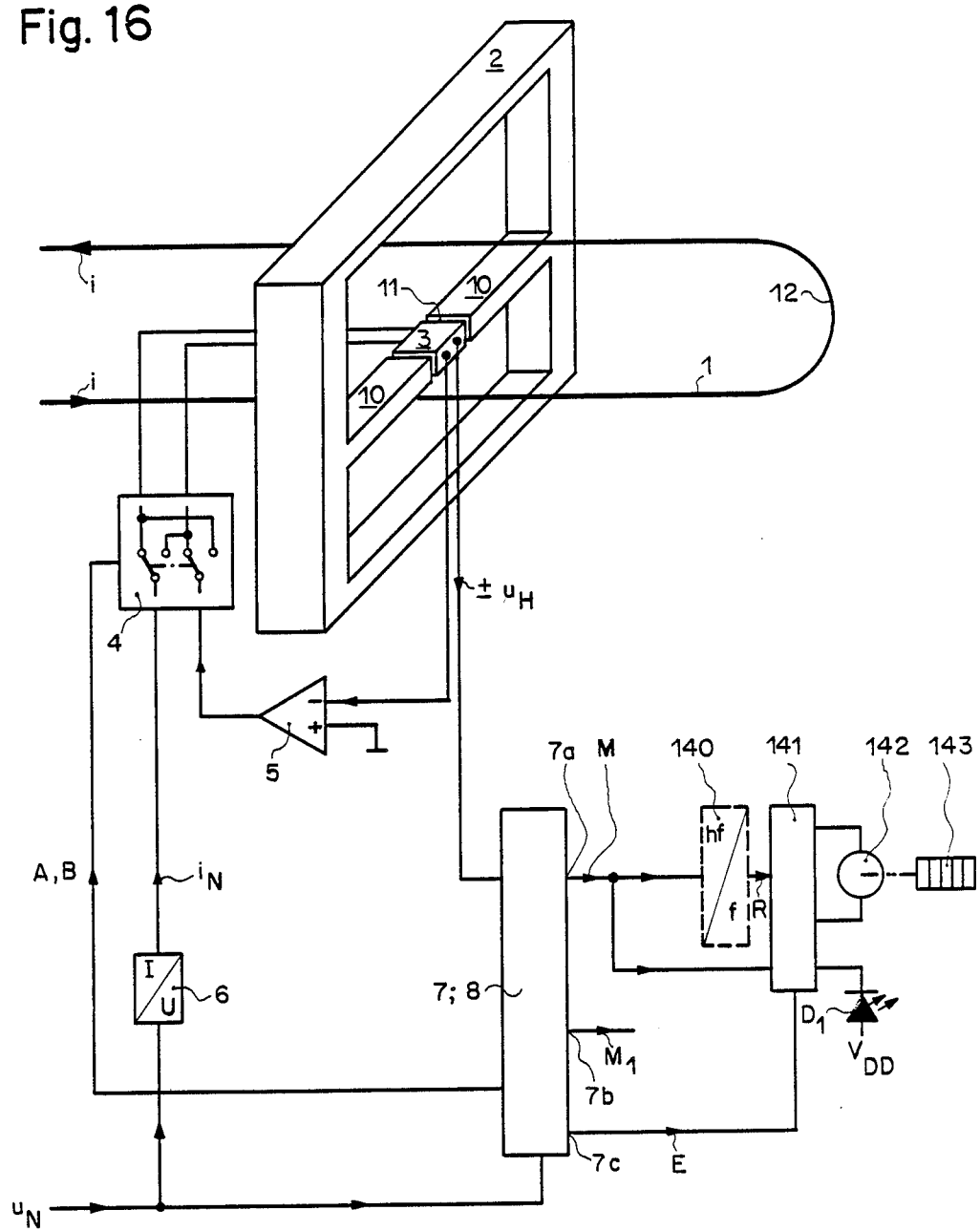
FIG. 16 shows a block diagram of an electric meter.

The arrangement for measurement of power illustrated in FIG. 1, is preferably used for construction of an electrical meter. The construction of such an electrical meter is illustrated in FIG. 16 and comprises, in addition to the components already mentioned in the description of FIG. 1, another optional frequency divider 140, an interface circuit 141, a stepping motor 142, an indicator 143 and an optical device symbolized by the luminous diode $D_1$. For reasons of simplicity of the drawing, the control device 8 and the voltage/frequency converter 7 are combined in FIG. 16 as a single processing unit 7;8 that is supplied by the Hall output voltage $\pm u_H$ on one hand and by the main supply voltage $u_N$. Also, the processing unit 7;8 has an output for the switch signal A or B that are prepared if necessary, and the three outputs 7a, 7b and 7c of the voltage/frequency converter 7. The output where the switch signal A or B is located is connected to the control input of the pole switch 4. The signal output 7a of the processing unit 7;8 (the signal M that corresponds to a positive power is located here) is connected to an input of the frequency divider 140 and to a set back (i.e., reset) input of the interface circuit 141. The output 7c of the processing unit 7;8 where the periodic signal E is located is led to a clock input of the interface circuit 141, the signal input of which is connected to the output of the frequency divider 140. A two-pole output of the interface circuit 141 is connected to the electrical connections of the stepping motor 142 that drives the indicator 143 mechanically. An additional output of the interface circuit 141 is connected single-poled to the cathode of the luminous diode $D_1$, the anode of which lies at the positive direct supply voltage $V_{DD}$. In case the electricity meter measures only positive power, the signal output 7b of the processing unit 7;8 is not connected. The frequency divider 140 is, for example, programmable. The frequency of the rectangular pulses comprising the signal M at the signal output 7a is proportional to the power. The frequency is divided in the frequency divider 140 by the number h. The rectangular pulses produced by the frequency divider 110 are processed, in the following interface circuit 141 so that they can control the stepping motor 142. With the reception of each pulse, the stepping motor advances one step forwards. After a predetermined number of steps, for instance 300 steps, the value indicated by the indicator 143 is incremented by one. Instead of an electric-mechanical indicator 143, a fully electronical luminous diode or a liquid-crystal indicator may be used. In this case, the stepping motor 142 and its interface circuit 141 may be omitted and instead an additional frequency divider may be used with an accumulator. By way of the pulse count, the power is integrated, and the energy is determined. The luminous diode $D_1$ blinks, for instance, with the rhythm of the pulse of the signal M and can be used to measure the pulse frequency optically.

The arrangements illustrated in FIGS. 1 and 16 have the following advantages:

By way of using the approximately closed ferromagnetic core 2 (see FIGS. 1, 12, 13), the intelligence signal is amplified by a factor $\mu$ without the offset voltage or other interference signals being amplified at the same time. The factor $\mu$ characterizes the permeability of the ferromagnetic material.

By way of using two signal sources 19 and 20 and the switch device 4;18 or and 4;15;18, the periodic switching of the intelligence signal is made possible without offset voltages or other interference signals of the process electronics being switched at the same time. This permits the elimination of the offset voltages and the interference signals or at least reduces them significantly.

Both advantages result in an improvement in the ratio of the intelligence signal and the interference signal. By way of using the Hall elements illustrated in FIGS. 5 and 6, which on the one hand has a high sensitivity and on the other hand has connections to compensate interference signals in the form of gate connections OL and OR, the ratio of the intelligence signal and the interference signal is additionally improved significantly.

By way of using the simple control amplifier 5, the use of an expensive and complicated differential amplifier at the output of the Hall element 3 is avoided.

The construction of a measuring transformer used in FIGS. 12 through 15, especially the use of three air gaps and the special position of the two outer air gaps have the advantage that its installation is especially precise, simple and dependable without worsening the linearity and the phase error and improving the air gap tolerances.

Finally, the above-described embodiments of the invention are intended to be illustrative only. Numerous, alternative embodiments may be devised by those skilled in the art, without departing from the spirit and scope of the following claims.

We claim:

1. An arrangement for measuring electrical power comprising:
    an electrical conductor traversed by an electrical current i,
    a Hall element,
    a voltage-to-current converter for transforming an electrical voltage $u_N$ into a proportional supply current $i_N$ for said Hall element, said Hall element being adapted to produce an intelligence containing output signal $u_H$ that is proportional to the product ($\pm i \cdot u_N$) of the current i and the voltage $u_N$, a ferromagnetic core that has at least one air gap and is excited by the current i, said Hall element being arranged in said air gap, a voltage-to-frequency converter for transforming the Hall element output voltage $\pm u_H$ into a proportional pulse frequency, said voltage-to-frequency converter having an integrator including a capacitor and at least two signal sources, and switching means for periodically switching an intelligence containing signal component proportional to said signal $\pm u_H$ and for switching said signal sources to compensate an offset voltage.

2. An arrangement of claim 1, wherein the Hall element comprises a semi-conductor material of a predetermined conductivity type, and a linear arrangement of electrodes at a surface of the semiconductor material including at least a first outer current electrode, a first sensor electrode, a center current electrode, a second sensor electrode and a second outer current electrode, the two sensor electrodes and also the two outer current electrodes being arranged approximately symmetrical to the center current electrode and at least each of the current electrodes having a contact diffusion region that is heavily doped with impurity atoms and that comprises material that has the same conductivity type as the semiconductor material.

3. An arrangement of claim 2 wherein a blocking layer is arranged between an active zone of the Hall element and the surface of the Hall element, said blocking layer covering at least the active zone of the Hall element.

4. The arrangement of claim 3 wherein said blocking layer comprises a material having a conductivity type opposite to that of said semiconductor material, said blocking layer having a contact for applying a voltage.

5. An arrangement of claim 2, wherein the contact diffusion regions of the two outer current electrodes are ring-shaped and each surrounds a contact diffusion region of a gate connection, the contact diffusion regions of the gate connections being heavily doped with impurity atoms and of the opposite conductivity type compared to said semiconductor material.

6. An arrangement of claim 2, wherein a deeply diffused, ring-shaped insulation region surrounds at least contact diffusion regions of the center current and sensor electrodes, the center of said insulation region being approximately formed by the contact diffusion region of the center current electrode, and its longitudinal axis running approximately parallel to the connection line of the current and sensor electrodes, the depth of said insulation being larger than the depth of the contact diffusion regions of the current and sensor electrodes, said insulating region being of a conductivity type opposite to that of said semiconductor material.

7. An arrangement of claim 6, wherein a further diffusion region is provided at the surface of the semiconductor material that is heavily doped with impurity atoms, said further diffusion region surrounding the insulating region in the shape of a ring, said further diffusion region having the same conductivity type as the semiconductor material.

8. An arrangement of claim 1, wherein the switching means comprises a pole switch and a circuit device, the pole switch being arranged in a supply-current conductor of the Hall element 3, the circuit device comprising two switches that have a shared connection that is connected to a non-grounded connection of the capacitor, while the other connection of each of said switches is led to a connection of one of the two signal sources, and wherein said signal sources are constant current sources supplying equal currents of opposite polarity.

9. An arrangement of claim 1 wherein the switch means comprises two, two-pole switches that are controlled by the same periodical switch signal and a one-pole switch, a first two-pole switch being arranged in the supply current conductor of the Hall element and a second two-pole switch being arranged after a second voltage-to-current converter that is incorporated in the voltage-to-frequency converter, said capacitor being connected at an output of said second two-pole switch, said second voltage-to-current converter together with the capacitor forming said integrator, the first of the two signal sources is connected to said second voltage-to-current converter in such a manner that the input current of the second two-pole switch is proportional to a sum signal which equals the sum of a reference signal produced by the first signal source and a signal that is proportional to the output signal of the Hall element, the second signal source is a constant current source, a connection of the second signal source is connected, depending on the position of said one-pole switch, to one or the other connection of the capacitor and a forwards/backwards counter is provided at the output of the voltage/frequency converter for purpose of subtraction of a fixed frequency.

10. An arrangement of claim 9, wherein the reference signal produced by the first signal source and the fixed frequency correspond at least approximately to half the value of a reference current supplied by the second signal source.

11. An arrangement of claim 9, wherein the first signal source is a constant current source and is connected at an output of the second voltage/current converter.

12. An arrangement of claim 9, wherein the first signal source is a constant voltage source and connected by way of an addition element to an input of the second voltage/current converter.

13. An arrangement of claim 9, wherein the first signal source comprises an Exclusive-Or-gate, a second forwards/backwards counter, an accumulator connected between the Or-gate and the second counter, and a digital-to-analog converter, said first signal source being connected by way of an addition element to the input of the second voltage-to-current converter.

14. An arrangement of claim 9, wherein the voltage-to-frequency converter comprises an output frequency divider that comprises at least an Exclusive-Or-gate, a forwards/backwards counter, two flip-flops and two And-gates.

15. An arrangement of claim 14, wherein the output frequency divider comprises a neutral-prevention circuit.

16. An arrangement of claim 15, wherein the neutral-prevention circuit comprises a mono-stable multivibrator, a flip-flop and an And-gate.

17. An arrangement of claim 16, wherein the mono-stable multivibrator comprises an And-gate and a counter.

18. An arrangement of claim 9, wherein the voltage-/current converter comprises three current sources.

19. An arrangement of claim 8, wherein each existing current source comprises an operational amplifier, a field effect transistor and at least a resistor.

20. An arrangement of claim 8, wherein a high-pass amplifier is arranged between the Hall element and the voltage-to-frequency converter.

21. An arrangement of claim 8, wherein a monitoring and control device is connected at an output side of the integrator, and said monitoring and control device comprises at least a comparator for monitoring the voltage at the capacitor and a flip-flop for control of the switching means.

22. An arrangement of claim 1, wherein a control amplifier exists for compensation of a reference potential associated with the output voltage of the Hall element, whereby an output connection of the Hall element that is carrying the reference potential is led to an inverting input of the control amplifier, a non-inverting input of said control amplifier being grounded and its output being connected to a first or second input connection of the Hall element by way of a pole switch.

23. An arrangement of claim 1, wherein
the ferromagnetic core has three legs and its center leg is surrounded at least partially by the electrical conductor, said ferromagnetic core having a center air gap and two outer air gaps, the center air gap containing the Hall element and the two outer air gaps being arranged at either of two ends of the center leg, and
the center leg and the Hall element together form a unit and
each of the two outer air gaps having a length in one direction that is larger than the length of the center air gap in the same direction.

24. An arrangement of claim 23, wherein
the center leg comprises two flat sheet-metal strips that are arranged, together with the Hall element, in a case of non-ferromagnetic material and
the outer air gaps are each filled by a wall of the case.

25. An arrangement of claim 23, wherein a yoke and the two outer legs of the ferromagnetic core are formed by a ring that comprises at least a ring-shaped bent iron-sheet.

26. An arrangement of claim 25, wherein the length of the ring is larger than its largest internal width.

27. An arrangement of claim 23, wherein the length of the center air gap, measured in the longitudinal direction of the center leg, is approximately as large as the width of the Hall element, measured in the same direction.

28. An arrangement of one claim 25, wherein the electrical conductor has a rectangular cross section and the ring is rectangular.

29. An arrangement of claim 23, wherein the center leg is between an outgoing and an incoming conducting path of the electrical conductor that are arranged parallel to one another.

30. An arrangement of claim 29, wherein the electrical conductor forms a U-shaped loop and the outgoing and incoming conducting paths of said loop are the parallel outgoing and incoming conducting paths of the electrical conductor.

31. An arrangement of claim 23 wherein
the electrical conductor forms at least two U-shaped loops that are arranged parallel and are connected electrically in series and both conductors of each loop are positioned parallel on top of one another and two outgoing conducting paths of the two loops and two incoming conducting paths of the two loops are arranged in the same plane next to one another and
the center leg with the Hall element is arranged between the two outgoing conducting paths and the two incoming conductivity paths.

32. An arrangement of claim 23, wherein
the electrical conductor forms at least two U-shaped loops that are connected electrically in series, one U-shaped loop being arranged inside the other U-shaped loop and conductors of both loops are positioned parallel and on top of one another, and
the center leg with the Hall element is arranged between two outgoing conducting paths on one hand and two incoming conducting paths on the other hand.

33. An arrangement of claim 25, wherein the electrical conductor comprises, at least within the ring, two parallel conductors that are arranged in such a manner that they each traverse the ring first in one direction, then, electrically insulated, cross over and traverse the ring again in the opposite direction and the center leg is arranged between the two conductors.

34. An arrangement of claim 24, wherein the center leg and the Hall element are arranged on a carrier of insulating material.

35. An arrangement of claim 34, wherein the carrier is the bottom of the case.

36. An arrangement of claim 35, wherein the case is made of ceramic material.

37. An arrangement of claim 34, wherein additional electronic elements are arranged on the carrier.

38. An arrangement of claim 23, wherein the ferromagnetic core comprises an iron-nickel alloy.

39. An arrangement of claim 25 wherein the ring is surrounded by an approximately parallel, ring-shaped outer shield.

40. An arrangement of claim 39, wherein the outer shield comprises deep-drawn cold rolled steel.

41. An arrangement of claim 39, wherein the outer shield is of an iron-nickel alloy.

42. An arrangement of claim 39, wherein a space exists between the ring and the outer shield.

* * * * *